US012119786B2

(12) United States Patent
Morioka et al.

(10) Patent No.: US 12,119,786 B2
(45) Date of Patent: Oct. 15, 2024

(54) DETERIORATION DIAGNOSIS DEVICE FOR SOLAR CELL STRING AND PHOTOVOLTAIC POWER GENERATION SYSTEM PROVIDED WITH THE SAME

(71) Applicant: Mitsubishi Electric Corporation, Tokyo (JP)

(72) Inventors: Takayuki Morioka, Tokyo (JP); Hidetada Tokioka, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 268 days.

(21) Appl. No.: 17/610,712

(22) PCT Filed: Jun. 3, 2019

(86) PCT No.: PCT/JP2019/022020
§ 371 (c)(1),
(2) Date: Nov. 12, 2021

(87) PCT Pub. No.: WO2020/245884
PCT Pub. Date: Dec. 10, 2020

(65) Prior Publication Data
US 2022/0224287 A1    Jul. 14, 2022

(51) Int. Cl.
*H02S 40/36*         (2014.01)
*G01R 31/367*       (2019.01)
(Continued)

(52) U.S. Cl.
CPC ............ *H02S 50/10* (2014.12); *G01R 31/367* (2019.01); *G01R 31/389* (2019.01); *G01R 31/392* (2019.01); *H02S 40/36* (2014.12)

(58) Field of Classification Search
CPC .. G01R 31/52; G01R 31/085; G01R 31/2812; G01R 31/389; G01R 31/392;
(Continued)

(56) References Cited

U.S. PATENT DOCUMENTS 10,833,628 B2    11/2020  Yura et al.
2019/0140590 A1*  5/2019  Yura ..................... G01R 31/54

FOREIGN PATENT DOCUMENTS

CN    109314488 A    2/2019
JP    2014-186022 A   10/2014
(Continued)

OTHER PUBLICATIONS

International Search Report and Written Opinion mailed on Aug. 20, 2019, received for PCT Application PCT/JP2019/022020, Filed on Jun. 3, 2019, 9 pages including English Translation.
(Continued)

*Primary Examiner* — Alexander Satanovsky
*Assistant Examiner* — Trung Q Nguyen
(74) *Attorney, Agent, or Firm* — XSENSUS LLP

(57) ABSTRACT

A deterioration diagnosis device for a solar cell string and a photovoltaic power generation system includes an impedance measuring instrument to measure a frequency characteristic of a first impedance between solar power generation units connected in the solar cell string and to measure a frequency characteristic of a second impedance, an analysis unit to calculate a first increment from an initial value of a series resistance component, and to calculate a second increment from an initial value of a resistance component between the first end of the plurality of solar power generation units connected in series and the frames in the solar cell string based on the frequency characteristic of the second impedance, and a deterioration determining unit to determine a position of a solar cell module having an increased resistance in the solar cell string based on the first increment and the second increment calculated by the analysis unit.

11 Claims, 10 Drawing Sheets

(51) Int. Cl.
  *G01R 31/389* (2019.01)
  *G01R 31/392* (2019.01)
  *H02S 50/10* (2014.01)

(58) Field of Classification Search
  CPC .... G01R 31/367; H02H 1/0015; H02S 50/10; H02S 40/36
  USPC ........ 324/761.01, 76.11, 500, 600, 691, 430, 324/434
  See application file for complete search history.

(56) References Cited

FOREIGN PATENT DOCUMENTS

| | | | |
|---|---|---|---|
| JP | 6091391 | B2 | 3/2017 |
| JP | 6214845 | B1 | 10/2017 |

OTHER PUBLICATIONS

Chinese Office Action issued Jun. 26, 2024, in corresponding Chinese Patent Application No. 201980096892.0, 30pp.

* cited by examiner

DETERIORATION DIAGNOSIS DEVICE FOR SOLAR CELL STRING AND PHOTOVOLTAIC POWER GENERATION SYSTEM PROVIDED WITH THE SAME

CROSS-REFERENCE TO RELATED APPLICATION

The present application is based on PCT filing PCT/JP2019/022020, filed Jun. 3, 2019, the entire contents of which are incorporated herein by reference.

TECHNICAL FIELD

The present application relates to a deterioration diagnosis device for a solar cell string and a solar power generation system provided with the same.

BACKGROUND ART

The solar cell module comprises, for example, a crystalline solar cell that is a solar cell formed using a single crystal or polycrystalline silicon substrate, or a thin film solar cell that is a solar cell formed on a glass substrate by depositing a silicon thin film, and the solar cells are connected in series or in parallel, to form a panel, and provided with a frame as an outer frame and a terminal box.

The solar cell string is constructed by preparing a plurality of these solar cell modules, by connecting the solar cells of the plurality of solar cell modules in series, and by fixing the frames of these solar cell modules to a common metal frame.

A plurality of solar cell strings are arranged in an array and combined with power transmission cables, a connection box, and a power conditioner to constitute a photovoltaic power generation system. Such photovoltaic power generation systems are used not only in general household power generation applications but also in large-scale photovoltaic power plants with a power generation capacity of 1 MW or more.

In general, solar cell modules have no mechanical parts that are operated and are said to have a lifetime of more than 20 years. However, in practice, there have been reports of problems occurring for various reasons within several years after the start of its operation. As causes of the problems, for example, an increase in resistance due to deterioration of the power generation layer in the solar cell or corrosion of the electrode portion, a decrease in light transmittance of the sealing material that is filled between the solar cell and the glass in order to protect the solar cell, an insulation deterioration, an increase in the wire resistance in the solar cell module, and a grounding failure of the metal frame for fixing the solar cell module, etc., are known.

These problems cause a reduction in the output of the solar cell module and may lead to an operation failure. For this reason, in order to increase the reliability of the photovoltaic power generation system and to promote the spread thereof, a technology capable of diagnosing the presence or absence of a failure in the photovoltaic power generation module or the photovoltaic power generation string is required. For example, as a method for diagnosing a failure of a solar cell string, a method for diagnosing a failure of a solar cell string by measuring an inductance of the solar cell string has been proposed (for example, refer to Patent Document 1).

CITATION LIST

Patent Document

Patent Document 1: Japanese patent No. 6214845

SUMMARY OF INVENTION

Problems to be Solved by Invention

However, in the conventional method of diagnosing the failure of the solar cell string, the failure diagnosis is performed on a solar cell string basis, and the solar cell module deteriorated within the solar cell string cannot be identified. Therefore, it is necessary to remove and check each of the solar cell modules one by one, and there is a problem in that it takes a lot of time and labor.

Therefore, this application has been made to solve these conventional problems, and an object thereof is to provide a deterioration diagnosis device for a solar cell string and a photovoltaic power generation system equipped therewith, which can identify the location of a deteriorated solar cell module within a solar cell string.

Means for Solving Problems

In order to achieve the above-mentioned object, a deterioration diagnosis device for a solar cell string includes a plurality of solar cell modules each of which has a solar power generation unit and a conductive frame, the solar power generation units of the plurality of solar cell modules being electrically connected in series, the frames of the plurality of solar cell modules being electrically connected in common, an impedance measuring instrument to measure a frequency characteristic of a first impedance between a first end and a second end of the plurality of solar power generation units connected in series in the solar cell string and to measure a frequency characteristic of a second impedance between the first end of the plurality of solar power generation units connected in series and the frames in the solar cell string, an analysis unit to calculate a first increment from an initial value of a series resistance component between the first end and the second end of the plurality of solar power generation units connected in series in the solar cell string based on the frequency characteristic of the first impedance, and to calculate a second increment from an initial value of a resistance component between the first end of the plurality of solar power generation units connected in series and the frames in the solar cell string based on the frequency characteristic of the second impedance, and a deterioration determining unit to determine a position of a solar cell module having an increased resistance in the solar cell string based on the first increment and the second increment calculated by the analysis unit.

Effect of Invention

In the deterioration diagnosis device for the solar cell string and the photovoltaic power generation system provided therewith which are configured as described above, the analysis unit calculates the first increment from the initial value of the series resistance component between the first end and the second end of the plurality of solar power generation units connected in series and the second increment from the initial value of the resistance component between the first end of the plurality of solar cell cells connected in series and the frame, and based on the first increment and the second increment calculated by the analysis unit, the deterioration determining unit determines the position of the solar cell module with an increased resistance in the solar cell string. This allows the position of the deteriorated solar cell module within the solar cell string to be determined.

MODES FOR CARRYING OUT INVENTION

Figure 1:
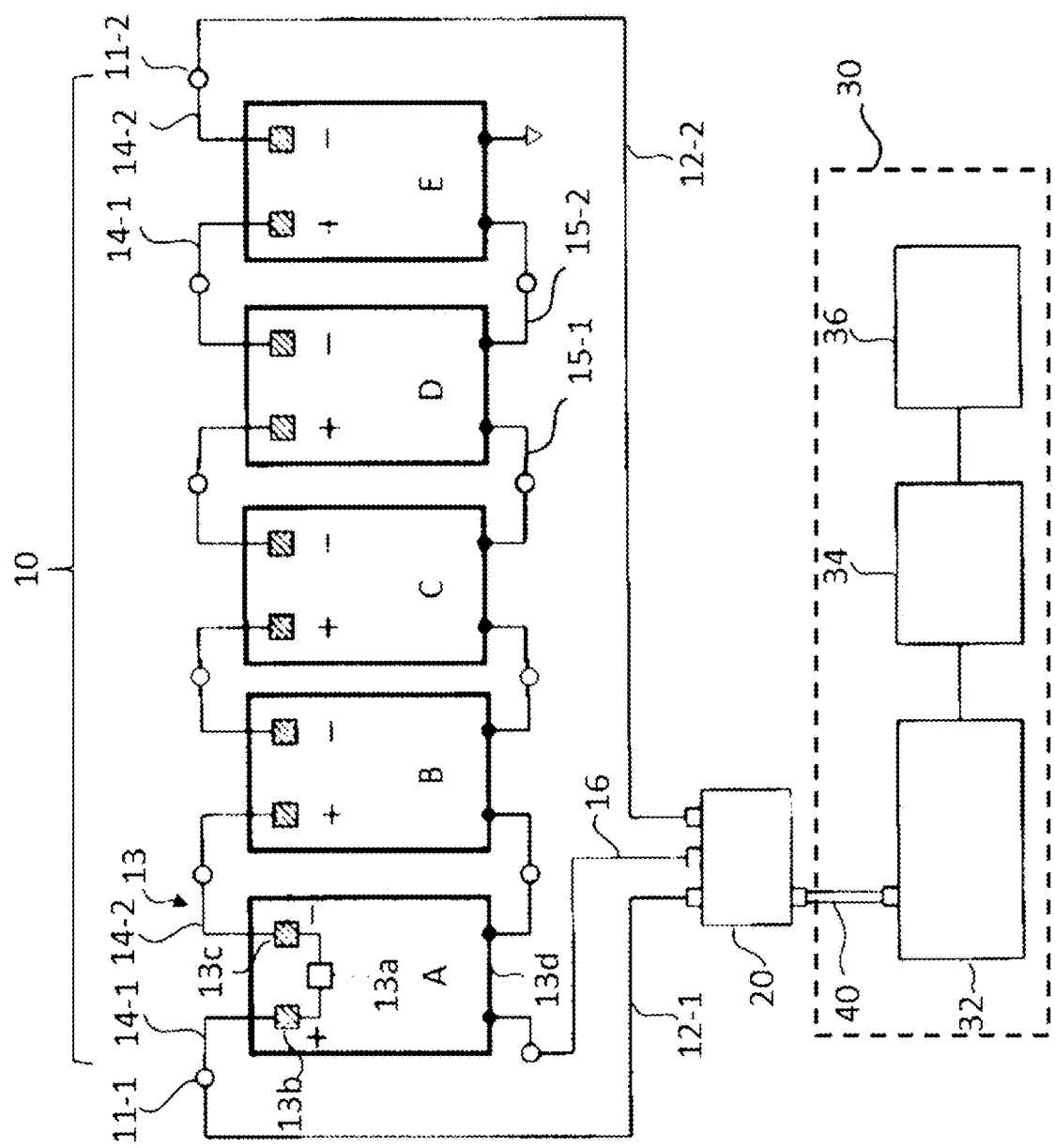
FIG. 1 is a schematic diagram showing a schematic configuration of a photovoltaic power generation system and a deterioration diagnosis device for a solar cell string according to Embodiment 1 of the present application.

First, a configuration of a deterioration diagnosis device for a solar cell string and that of a photovoltaic power generation system equipped with the device will be described referring to drawings. It should be noted that the drawings are schematic and conceptually describe functions or structures. In addition, the present application is not limited to the following embodiments. Except where noted, the basic configuration of the deterioration diagnosis device for the solar cell string and the photovoltaic power generation system equipped with the device is common to all embodiments. In addition, the same reference numerals are used for the same or equivalent components, which is common throughout the specification.

Embodiment 1

Figure 2:
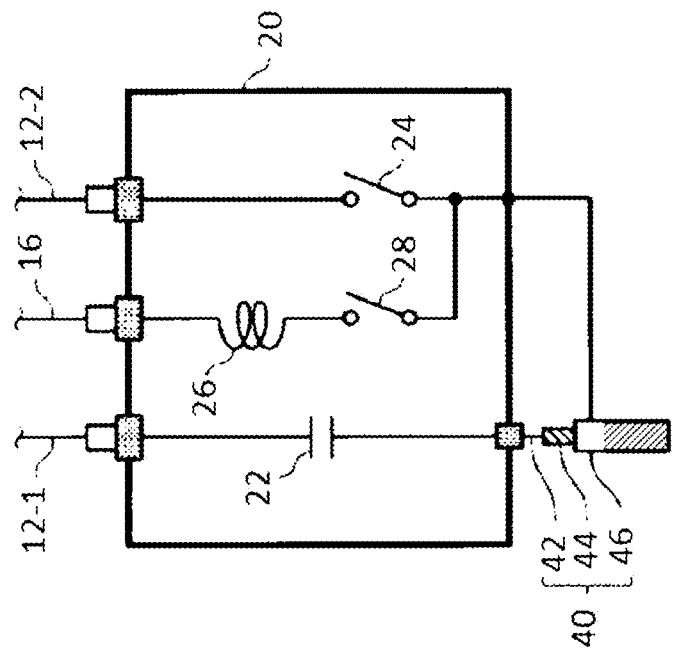
FIG. 2 is a diagram showing a schematic configuration of an inside of a connection box of the photovoltaic power generation system and the deterioration diagnosis device for the solar cell string according to Embodiment 1 of the present application.

FIG. 1 is a schematic diagram showing a schematic configuration of a photovoltaic power generation system and a deterioration diagnosis device for a solar cell string according to the present embodiment. FIG. 2 is a diagram showing a schematic configuration of an inside of a connection box for the photovoltaic power generation system and the deterioration diagnosis device for the solar cell string according to the present embodiment.

As shown in FIG. 1, the photovoltaic power generation system 100 includes the solar cell string 10, the connection box 20 connected to the solar cell string 10, the deterioration diagnosis device 30 that is connected to the connection box 20 and diagnoses deterioration of the solar cell string 10, a power transmission cable and a power conditioner (not shown). The solar cell string 10 is provided with an output terminal 11-1 on the positive electrode side and an output terminal 11-2 on the negative electrode side, and the output terminals 11-1, 11-2 are electrically connected to the connection box 20 via output cables 12-1, 12-2. Further, concerning the solar cell string 10, the output terminals 11-1, 11-2 are electrically connected to the power transmission cable and the power conditioner (not shown) via the output cables 12-1, 12-2 and switching means such as switches (not shown) in the connection box 20. Then, the electric power generated by the solar cell string 10 is output from the output terminals 11-1, 11-2 to the power transmission cable and the power conditioner (not shown) through the connection box 20.

The solar cell string 10 includes a plurality of solar cell modules 13 as shown in FIG. 1. Each of the plurality of solar cell modules 13 is provided with a solar power generation unit 13a, terminal boxes 13b, 13c, and a frame 13d. As an example of the solar cell string 10, although one solar cell string and five solar cell modules are shown in FIG. 1, a plurality of solar cell strings may be connected in parallel, and the number of solar cell modules is not limited to five, as long as two or more solar cell modules are connected in series.

The solar power generation unit 13a generates power in response to the received sunlight. For example, solar cells connected in series or in parallel are applied to the solar power generation unit 13a. The solar cell may be a solar cell composed of a semiconductor utilizing a PN junction, and for example, a crystalline solar cell composed of a single crystal silicon substrate or a thin film solar cell composed of a glass substrate and a thin film of silicon or the like is applied to the solar cell.

The terminal boxes 13b, 13c include a positive side terminal box 13b and a negative side terminal box 13c which are disposed on the rear side of the solar cell module 13 and from which the power generated by the solar power generation unit 13a is taken out. The positive side terminal box 13b is electrically connected to the output terminal 11-1 on the positive side, and the negative side terminal box 13c is electrically connected to the output terminal 11-2 on the negative side. As a result, the generated electric power taken out from the terminal boxes 13b and 13c is outputted to an outside of the solar cell string 10 via the output terminals 11-1, 11-2 and the connection box 20.

The frame 13d is a conductive frame such as a metal frame and is disposed on an outer periphery of the solar cell module 13. The frame 13d is generally electrically isolated from the solar power generation unit 13a, the terminal boxes 13b and 13c, and the output terminals 11-1, 11-2.

As shown in FIG. 1, in a plurality of the solar cell modules 13 of the solar cell string 10, a plurality of the solar power generation units 13a are electrically connected in series by output cables 14-1, 14-2. That is, in the present embodiment, the output cable 14-2 on the negative electrode side of one solar cell module 13 and the output cable 14-1 on the positive electrode side of another solar cell module 13 in any two adjacent solar cell modules 13 are connected in series. As a result, the output cable 14-1 of the solar cell module 13 located at a first end and the output cable 14-2 of the solar cell module 13 located at a second end are output cables not used for the series connection.

A plurality of frames 13d of a plurality of the solar cell modules 13 are electrically connected in common as shown in FIG. 1. As such a common connection, in the present embodiment, the frame 13d of one solar cell module 13 and the frame 13d of another solar cell module 13 in any two adjacent solar cell modules 13 are electrically connected to each other through ground wires 15-1, 15-2, and the ground wire 15-2 of the frame 13d of the solar cell module 13 located at the second end is grounded. Note that the connection between the frames 13d is not limited to such series connection, and for example, when the solar cell module 13 is fixed by a metal frame and installed outdoors, the frames 13d may be electrically connected by the frame instead of the ground wire. Further, the ground wire 15-1 of the frame 13d of the solar cell module 13 located at the first end is electrically connected not only to the frame 13d of the adjacent solar cell module 13 but also to the connection box 20 via a grounding wire 16.

As shown in FIG. 2, the connection box 20 includes a blocking capacitor 22 for cutting DC, one end of which is connected to the output cable 12-1, a switch 24, one end of which is connected to the output cable 12-2, an inductor 26, one end of which is connected to the grounding wire 16, for adjusting a resonance point, and a switch 28, which is connected to the other end of the inductor 26. The other end of the blocking capacitor 22 and the other ends of the switches 24, 28 are connected to a coaxial cable 40.

As shown in FIG. 2, the coaxial cable 40 includes a center conductor 42, an insulating dielectric 44, and an outer conductor 46. The center conductor 42 is electrically connected to the other end of the blocking capacitor 22 and is connected to a measurement terminal of an impedance measuring instrument 32 of the deterioration diagnosis device 30 of FIG. 1, which will be described later. The outer conductor 46 is electrically connected to the other end of the switches 24, 28 and is connected to a ground terminal of the impedance measuring instrument 32 of the deterioration diagnosis device 30 of FIG. 1, which will be described later. The center conductor 42 and the outer conductor 46 are electrically isolated from each other by the dielectric 44.

Here, the switch 28 and the inductor 26 for adjusting the resonance point are connected in series to constitute a resonance point adjusting circuit. The value of the inductor 26 for adjusting the resonance point may be selected so that the resonance frequency of the second impedance to be measured falls within the measurement frequency range of the impedance measuring instrument 32 described later. Note that the positional relationship between the switch 28 and the inductor 26 for adjusting the resonance point may be opposite to that shown in FIG. 2.

Further, the switches 24, 28 each may be a manual toggle switch, a switching element such as a diode switch or a metal-oxide-semiconductor-field-effect-transistor (MOSFET), which is driven by a gate signal, or a mechanical relay.

As shown in FIG. 1, a deterioration diagnosis device 30 for diagnosing deterioration of the solar cell string 10 includes the impedance measuring instrument 32, an analysis unit 34, and a deterioration determining unit 36.

The impedance measuring instrument 32 measures the frequency characteristic of a first impedance between the first end and the second end of a plurality of the solar power generation units 13a connected in series in the solar cell string 10 and measures the frequency characteristic of a second impedance between the first end of the positive electrode side of a plurality of the solar power generation units 13a connected in series and the frame 13d in the solar cell string 10.

Specifically, as shown in FIGS. 1 and 2, the impedance measuring instrument 32 is electrically connected to the output terminal 11-1 on the positive electrode side through the blocking capacitor 22 in the connection box 20 and is electrically connected to the output terminal 11-2 on the negative electrode side through the switch 24 in the connection box 20. Therefore, by turning on the switch 24 and turning off the switch 28, it is possible to measure the frequency characteristic of the first impedance between the first end and the second end of a plurality of the solar power generation units 13a connected in series in the solar cell string 10. Then, the resonance point of the first impedance is determined from the frequency characteristic of the measured first impedance, and the value of the first impedance at the resonance point is output to the analysis unit 34 in the subsequent stage.

As shown in FIGS. 1 and 2, the impedance measuring instrument 32 is electrically connected to a commonly connected frame 13d via the switch 28 and the inductor 26 in the connection box 20. Therefore, by turning off the switch 24 and turning on the switch 28, it is possible to measure the frequency characteristic of the second impedance between the first end of a plurality of the solar power generation units 13a connected in series and the frame 13d in the solar cell string 10. Then, the resonance point of the second impedance is determined from the frequency characteristic of the measured second impedance, and the value of the second impedance at the resonance point is output to the analysis unit 34 in the subsequent stage.

Since the impedance measuring instrument 32 can determine the resonance point by practically sweeping the measurement frequency, in this embodiment, the impedance measuring instrument 32 measures the frequency characteristics of the first impedance and the second impedance using the high-frequency measurement signal. Note that the operation "practically sweeping the measurement frequency" refers to, for example, an operation of continuously sweeping the frequency or an operation of discretely sweeping the frequency at regular intervals. As such an impedance measuring instrument 32, for example, a network analyzer, an impedance analyzer, a combination analyzer or the like may be applied, or a combination of a frequency variable high frequency oscillator, a current sensor, a voltage sensor, and an A/D converter or a computing device may be applied.

Although the impedance measuring instrument 32 measures the frequency characteristic of the second impedance between the frame 13d and the first end of the positive electrode side of a plurality of the solar power generation units 13a connected in series in the solar cell string 10, it is not limited to the positive electrode side and the impedance measuring instrument 32 may measure the impedance between the frame 13d and the second end on the negative electrode side of a plurality of the solar power generation units 13a connected in series in the solar cell string 10.

Note that, in the example of FIG. 1, it is assumed that the housing of the impedance measuring instrument 32 is grounded by a 3P type outlet or the grounding wire, but the housing of the impedance measuring instrument 32 is not necessarily grounded and may be electrically floating. Further, although of the solar cell string 10 shown in FIG. 1 is grounded through the housing of the impedance measuring instrument 32 by the ground wiring 16 when the switch 28 is ON, it may be grounded by using another grounding wire separately. The presence or absence of the grounding of the housing of the impedance measuring instrument 32 and the solar cell string 10 does not substantially affect the diagnosis result of the deterioration diagnosis device 30 for the solar cell string 10 according to the present embodiment.

The measurement of the frequency characteristics of the first impedance and the second impedance by the impedance measuring instrument 32 is carried out during a time when the solar cell module 13 is in a dark state, for example, during a night time when the solar power generation unit 13*a* of the solar cell module 13 does not generate power. Here, if light accidentally is incident on the light-receiving face of the solar cell module 13 during the measurement of the frequency characteristics of the first impedance and the second impedance, the solar power generation unit 13*a* in the solar cell module 13 generates power, and a relatively large DC voltage of, for example, several tens to several hundreds of volts is generated between the terminal box 13*b* and the terminal box 13*c*.

In order to protect the impedance measuring instrument 32 from this overvoltage, in the present embodiment, the above-described blocking capacitor 22 for DC cutting is provided between the solar cell string 10 and the measurement terminal of the impedance measuring instrument 32. Meanwhile, since the frequency of the measurement signal supplied from the measurement terminal of the impedance measuring instrument 32 to the solar cell string 10 is relatively high as described above, the measurement signal can easily pass through the blocking capacitor 22 and is transmitted to the solar cell string 10.

The analysis unit 34 calculates a first increment $\Delta R_s$ from the initial value of a series resistance component between the first end and the second end of a plurality of the solar power generation units 13*a* connected in series in the solar cell string 10 on the basis of the frequency characteristic of the first impedance, and calculates a second increment $\Delta R_{frame}$ from an initial value of a resistance component between the first end of a plurality of the solar power generation units 13*a* connected in series and the frame 13*d* in the solar cell string 10 on the basis of the second impedance.

Although the details will be described later, the analysis unit 34 defines the value of the first impedance at the resonance point input from the impedance measuring instrument 32 as a parasitic series resistance component Rs between the first end and the second end of a plurality of the solar power generation units 13*a* connected in series in the solar cell string 10. The analysis unit 34 calculates the first increment $\Delta R_s = R_s - R_{s0}$ from the initial value $R_{s0}$ of the series resistance component between the first end and the second end of a plurality of the solar power generation units 13*a* connected in series in a solar cell string 10.

Further, the analysis unit 34 defines the value of the second impedance at the resonance point input from the impedance measuring instrument 32 as the parasitic resistance component $R_{frame}$ between the first end of a plurality of the solar power generation units 13*a* connected in series in the solar cell string 10 and the frame 13*d*. The analysis unit 34 calculates the second increment $\Delta R_{frame} = R_{frame} - R_{frame0}$ from the initial value $R_{frame0}$ of the parasitic resistance component between the first end of a plurality of the solar power generation units 13*a* connected in series and the frame 13*d* in a solar cell string 10.

Then, the analysis unit 34 outputs the calculated first increment $\Delta R_s$ and second increment $\Delta R_{frame}$ to the deterioration determining unit 36.

On the basis of the first increment $\Delta R_s$ and the second increment $\Delta R_{frame}$ calculated by the analysis unit 34, the deterioration determining unit 36 determines the position of the solar cell module 13 with an increased resistance in the solar cell string 10.

Although details will be described later, the deterioration determining unit 36 calculates a parameter X depending on a position of the increased resistance in the solar cell string 10 as $X = \Delta R_{frame} / \Delta R_s$ by the first increment $\Delta R_s$ and the second increment $\Delta R_{frame}$ calculated by the analysis unit 34. Then, on the basis of the calculated parameter X, the solar cell module 13 with the increased resistance value occurring within the solar cell string 10 is identified.

Here, the analysis unit 34 and the deterioration determining unit 36 are composed of, for example, a processor or a central processing unit (CPU) and a storage device such as a semiconductor memory (not shown), and are implemented by the processor or CPU executing a program stored in the storage device such as the semiconductor memory. In addition to the analysis unit 34 and the deterioration determining unit 36, the control of the impedance measuring instrument 32 and the control such as the storing and transferring of the measurement data may be implemented as functions of the processor or the CPU, or a series of operations from the measurement to the output of the diagnosis result may be automatically performed.

Further, in the present embodiment, the first increment $\Delta R_s$ and the second increment $\Delta R_{frame}$ are calculated in the analysis unit 34, and the parameter X is calculated in the deterioration determining unit 36, but it is also possible to calculate the first increment $\Delta R_s$, the second increment $\Delta R_{frame}$, and the parameter X in the analysis unit 34, and only to identify the solar cell module 13 with the increased resistance occurring within the solar cell string 10 also on the basis of the parameter X calculated by the analysis unit 34 in the deterioration determining unit 36.

Thus, the deterioration diagnosis device 30 for the solar cell string 10 and the photovoltaic power generation system 100 according to the present embodiment is configured as described above.

Figure 3:
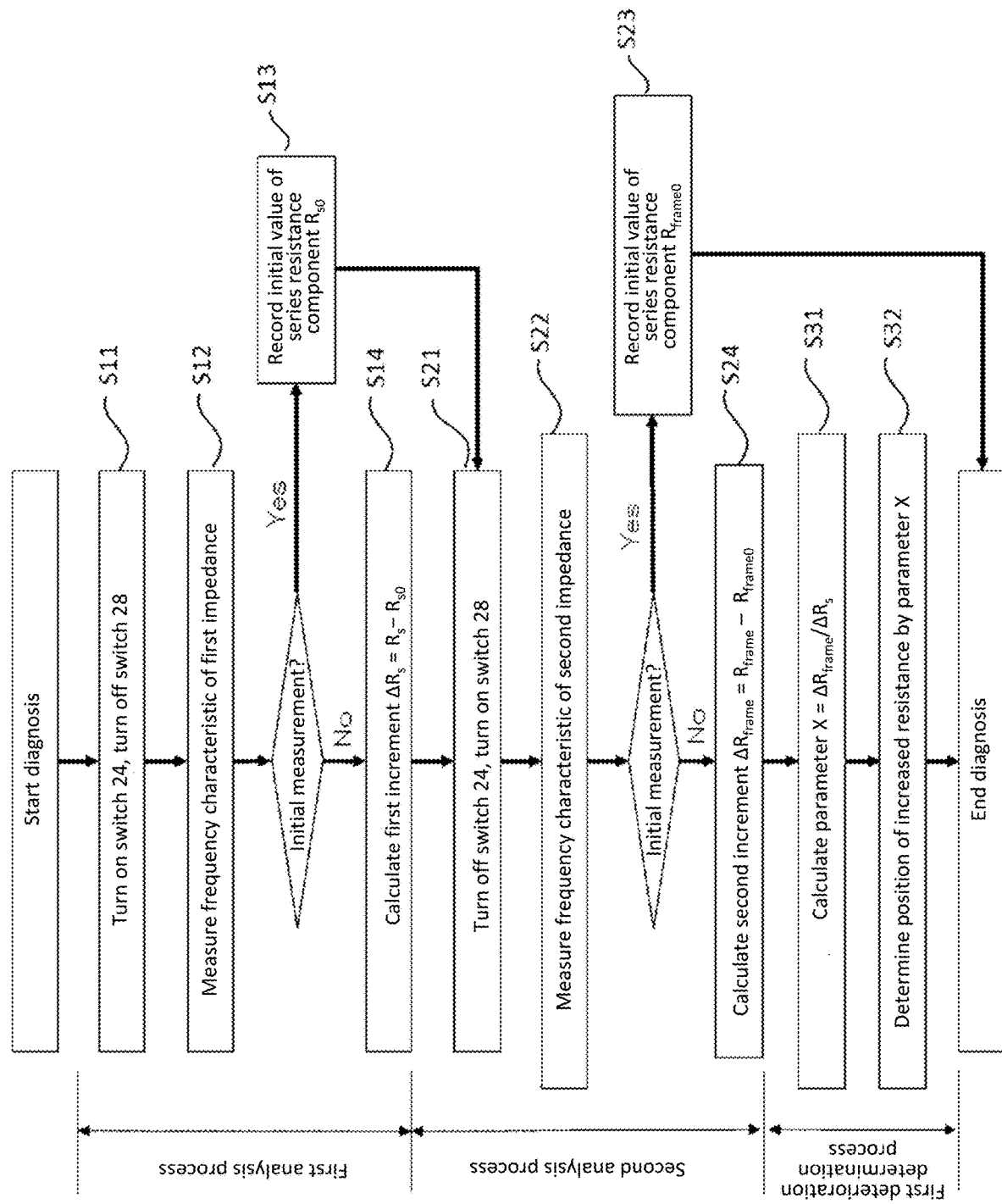
FIG. 3 is a flowchart showing operation of the deterioration diagnosis device according to Embodiment 1 of the present application.

Next, the operation of the deterioration diagnosis device 30 for the solar cell string 10 and the photovoltaic power generation system 100 according to the present embodiment will be described. FIG. 3 is a flowchart showing the operation of the deterioration diagnosis device 30 according to the present embodiment. Here, in the deterioration diagnosis device 30 for the solar cell string 10 and the photovoltaic power generation system 100 according to the present embodiment, the diagnosis is started at a time when the solar cell module 13 is in the dark state, for example, at night when the solar power generation unit 13*a* of the solar cell module 13 does not generate power.

First, when the deterioration diagnosis device 30 starts a diagnosis of the solar cell string 10, the solar cell string 10 is disconnected from a power transmission cable and a power conditioner (not shown) for the solar power generation by a switching means such as a switch (not shown) in the connection box 20, and is connected to the deterioration diagnosis device 30.

Then, as shown in FIG. 3, when the diagnosis of the solar cell string 10 is started, a first analysis process is performed.

First, the switch 24 of the connection box 20 is turned on, and the output terminal of the terminal box 13*c* on the negative side of the solar cell string 10 is electrically connected to the outer conductor 46 of the coaxial cable 40 and the ground terminal of the impedance measuring instrument 32. Then, the switch 28 of the connection box 20 is turned off to electrically isolate the frame 13d of the solar cell module 13 from the ground terminal of the impedance measuring instrument 32 (S11).

Next, with the switch 24 turned on and the switch 28 turned off, the impedance measuring instrument 32 measures the frequency characteristic of the first impedance between the first end and the second end of the plurality of solar power generation units 13a connected in series in the solar cell string 10 (S12). Then, the resonance point of the first impedance is determined from the frequency characteristic of the measured first impedance, and the value of the first impedance at the resonance point is output to the analysis unit 34 in the subsequent stage.

Then, the analysis unit 34 defines the value of the first impedance at the resonance point input from the impedance measuring instrument 32 as the parasitic series resistance component Rs between the first end and the second end of a plurality of the solar power generation units 13a connected in series in the solar cell string 10. In the case where the impedance measurement process of step S12 is the initial measurement, which is the first measurement after the deterioration diagnosis device 30 is installed, the analysis unit 34 records the initial value $R_{s0}$ of the parasitic series resistance component in a storage device such as a semiconductor memory (S13), and the process proceeds to step S21.

Here, for the series resistance component Rs, the frequency characteristic of the first impedance between the first end and the second end of a plurality of the solar power generation units 13a connected in series in the solar cell string 10 is measured in, for example, the range of 1 kHz to 1 MHz, and the impedance value which is the minimum value obtained at the resonance point is defined as the parasitic series resistance component Rs of the solar cell string 10.

After the initial measurement, the analysis unit 34 defines the value of the first impedance at the resonance point input from the impedance measuring instrument 32 as the parasitic series resistance component Rs between the first end and the second end of a plurality of the solar power generation units 13a connected in series in the solar cell string 10. The analysis unit 34 calculates a first increment $\Delta R_s = R_s - R_{s0}$ from the initial value $R_{s0}$ of the parasitic series resistance component Rs between the first end and the second end of a plurality of the solar power generation units 13a connected in series in the solar cell string 10, and outputs the calculated first increment $\Delta R_s$ to the deterioration determining unit 36 (S14).

Next, when the first analysis process is completed, the second analysis process is performed.

First, the switch 24 of the connection box 20 is turned off to electrically isolate the output terminal of the terminal box 13c on the negative side of the solar cell string 10 from the outer conductor 46 of the coaxial cable 40 and the ground terminal of the impedance measuring instrument 32. Then, the switch 28 of the connection box 20 is turned on to electrically connect the frame 13d of the solar cell module 13 and the ground terminal of the impedance measuring instrument 32 (S21).

Next, with the switch 24 turned off and the switch 28 turned on, the impedance measuring instrument 32 measures the frequency characteristic of the second impedance between the first end of the positive electrode side of a plurality of the solar power generation units 13a connected in series in the solar cell string 10 and the frame 13d of the solar cell module 13 (S22). Then, the resonance point of the second impedance is determined from the frequency characteristic of the measured second impedance, and the value of the second impedance at the resonance point is output to the analysis unit 34 in the subsequent stage.

Then, the analysis unit 34 defines the value of the second impedance at the resonance point input from the impedance measuring instrument 32 as the parasitic resistance component $R_{frame}$ between the first end of a plurality of the solar power generation units 13a connected in series and the frame 13d in the solar cell string 10. In the case where the impedance measurement process of step S22 is the initial measurement, which is the first measurement after the deterioration diagnosis device 30 is installed, the initial value $R_{frame0}$ of the parasitic series resistance component is recorded in the storage device such as the semiconductor memory (S23), and the diagnosis of the initial measurement is ended.

Here, as the series resistance component $R_{frame}$, the frequency characteristic of the second impedance between the first end of a plurality of the solar power generation units 13a connected in series and the frame 13d, for example, in the solar cell string 10 is measured in the range between 1 kHz and 1 MHz, and the impedance value which is the minimum value obtained at the resonance point is defined as the parasitic resistance component $R_{frame}$ of the solar cell string 10.

After the initial measurement, the analysis unit 34 defines the value of the second impedance at the resonance point input from the impedance measuring instrument 32 as the parasitic resistance component $R_{frame}$ between the first end of a plurality of the solar power generation units 13a connected in series and the frame 13d in the solar cell string 10. The analysis unit 34 calculates a second increment $\Delta R_{frame} = R_{frame} - R_{frame0}$ from the initial value $R_{frame0}$ of the parasitic resistance component $R_{frame}$ between the first end of a plurality of the solar power generation units 13a connected in series and the frame 13d in the solar cell string 10, and outputs the calculated second increment $\Delta R_{frame}$ to the deterioration determining unit 36 (S24).

Next, when the second analysis process is completed, a first deterioration determination process is performed.

First, the deterioration determining unit 36 calculates a parameter $X = \Delta R_{frame}/\Delta R_s$ on the basis of the first increment $\Delta R_s$ and the second increment $\Delta R_{frame}$ calculated in the first analysis process and the second analysis process (S31).

Although details will be described later, since the parameter X is a parameter that depends on the position of the solar cell module 13 in the solar cell string 10, the deterioration determining unit 36 identifies the solar cell module 13 in which the increase in the resistance value has occurred in the solar cell string 10 on the basis of the parameter X (S32).

At this time, in an assumed case in which the resistance value of one solar cell module 13 in the solar cell string 10 is greatly increased due to, for example, deterioration of the power generation layer in the solar cell or corrosion of the electrode portion, the deterioration determining unit 36 determines that the first increment $\Delta R_s$ calculated by the analysis unit 34 is larger than a predetermined threshold value. Then, the deterioration determining unit 36 can notify a user of the position of the solar cell module 13 in which the increase in the resistance value has occurred and which is determined on the basis of the parameter X.

In addition, in the present embodiment, the second analysis process is performed after the first analysis process, but the first analysis process may be performed after the second analysis process.

Next, a detailed description will be given on the operation principle of the deterioration diagnosis device 30 for the solar cell string 10 and the photovoltaic power generation system 100 according to the present embodiment.

Figure 4:
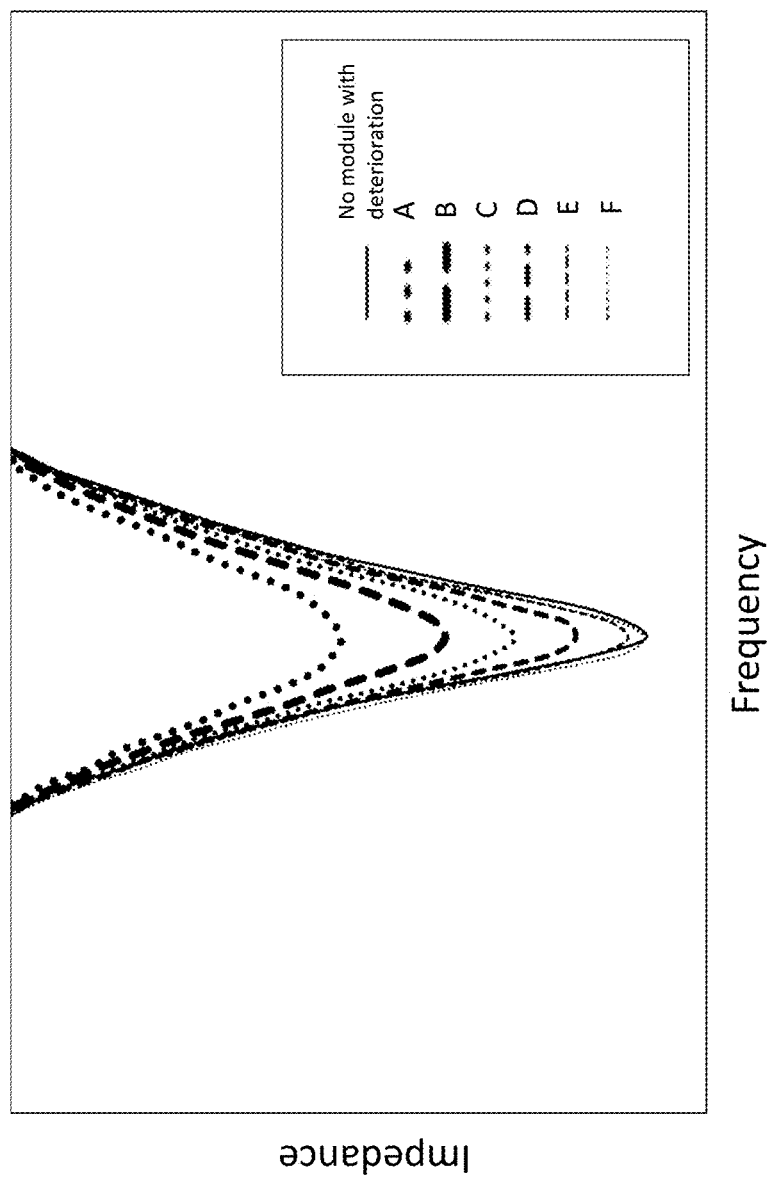
FIG. 4 shows an example of a frequency characteristic of a second impedance between an output terminal 11-1 and a frame 13d for each position of the solar cell module whose resistance has increased within the solar cell string according to Embodiment 1 of the present application.

FIG. 4 is a diagram showing an example of frequency characteristics of the second impedance between the output terminal 11-1 and the frame 13*d* for each position of the solar cell module 13 with an increased resistance in the solar cell string 10 according to the present embodiment. FIG. 4 shows the second impedance frequency characteristics around the resonance point in a case where the series resistance component Rs of one of the solar cell modules 13 increases by 10Ω in the solar cell modules 13 of A to E in the solar cell string 10 of FIG. 1.

As shown in FIG. 4, in contrast to a case in which the series resistance component Rs does not increase, it can be seen that the impedance values at the resonance point, that is, the series resistance components $R_{frame}$ tend to decrease in the order of A to F. Here, F in FIG. 4 is for an assumed case in which a series resistance component is increased by 10Ω between E of the solar cell module 13 and the output cable 12-2 for some reason.

Figure 5:
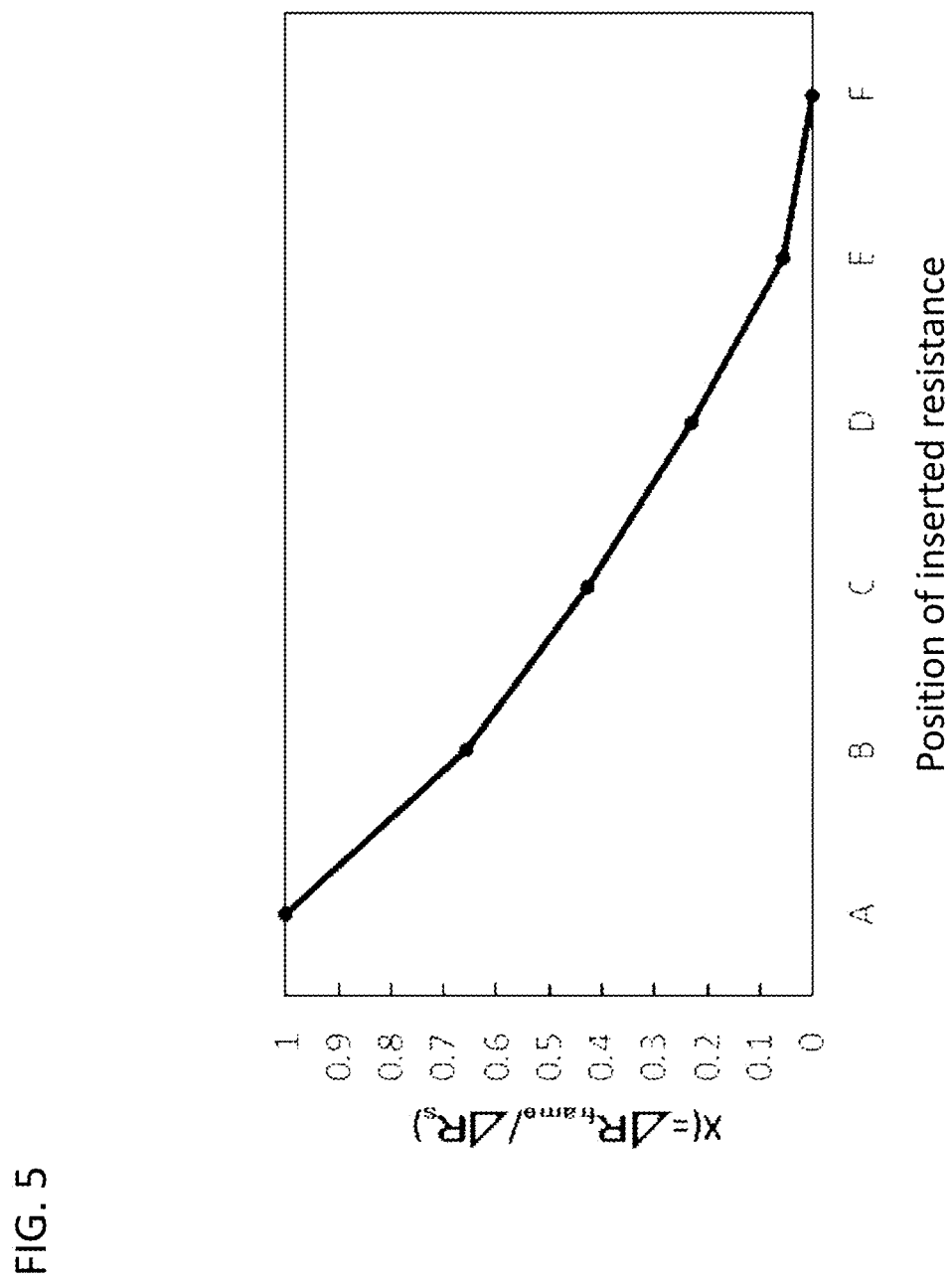
FIG. 5 shows an example of relationship between a parameter X and a position of the solar cell module 13 with an increased resistance according to Embodiment 1 of the present application.

FIG. 5 shows an example of the relationship between the parameter X and the position of the solar cell module 13 with an increased resistance according to the present embodiment. FIG. 5 shows a relationship between the value of parameter X calculated from $R_{frame}$ and Rs obtained in FIG. 4 and the position of the solar cell module in which the series resistance component is increased. It can be confirmed that the value of the parameter X tends to approach from 1 to 0 in accordance with the solar cell module 13 in which the resistance has increased in the order of A, B, C, D, E, and F.

Figure 6:
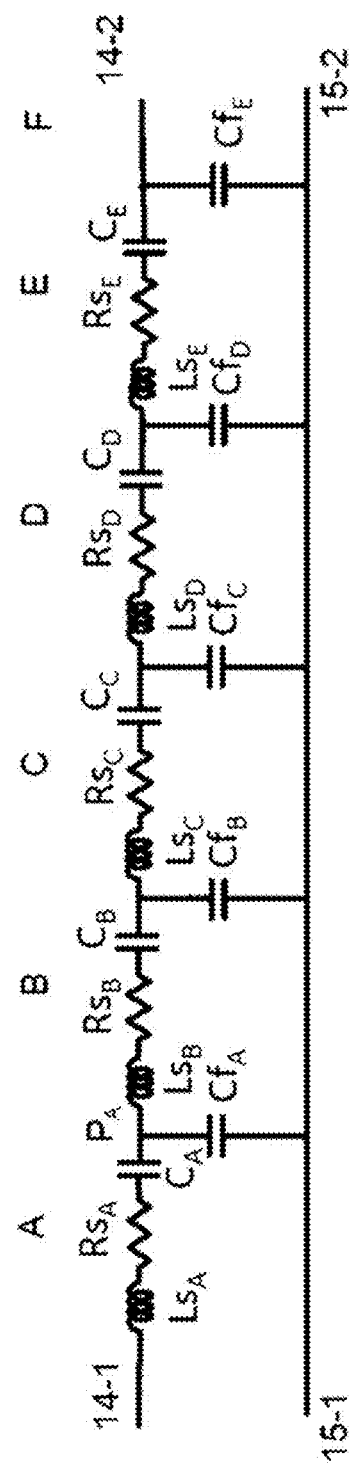
FIG. 6 shows an equivalent circuit model of the solar cell string according to Embodiment 1 of the present application.
Figure 7:
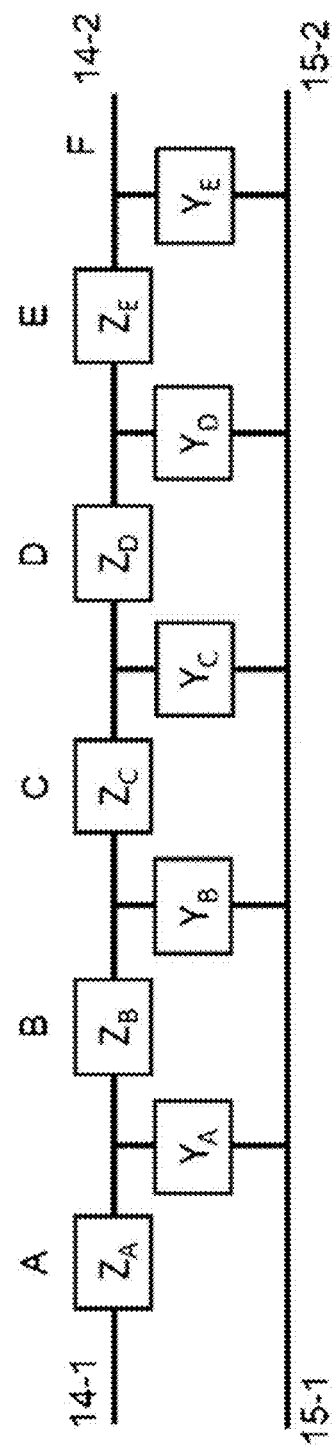
FIG. 7 is a simplified view of an equivalent circuit model of the solar cell string according to Embodiment 1 of the present application.

The following describes in detail why the parameter X depends on the position of the increased resistance within the solar cell string 10. FIG. 6 is a diagram showing an equivalent circuit model of the solar cell string according to the present embodiment. FIG. 7 is a simplified view of the equivalent circuit model of the solar cell string according to the present embodiment.

As shown in FIG. 6, each solar cell module 13 includes a series resistance component Rs due to an electrode, a cable or the like, an inductance component Ls due to an electrode, a cable or the like, a series capacitance component C due to a capacitance between pn junctions of solar cells, and a capacitance component $C_f$ between itself and the frame. Therefore, a circuit model can be shown in a simplified way in which the series resistance components Rs and the inductance components Ls in a plurality of the solar cell modules 13 are connected in series, and each of the solar cell modules 13 is connected to the frame 13*d* via the capacitance component $C_f$, the frame being connected to the grounding wires 15-1, 15-2.

For example, consider a case where the series resistance component $R_{sA}$ in A of the solar cell module 13 increases by ΔR. When the impedance between the output terminal 11-1 and the frame terminal of the solar cell string 10 is measured, since the series resistance component $R_{sA}$ is connected in series between the output terminal 11-1 and the frame 13*d*, the increment $\Delta R_{frame}$ of the parasitic resistance component $R_{frame}$ is equal to ΔR, and the parameter X is as follows: $X=\Delta R_{frame}/\Delta R_s=1$.

In contrast, consider a case where the series resistance component $R_{sB}$ in B of the solar cell module 13 increases by ΔR. In this case, the current flowing from the output terminal 11-1 for the solar cell string 10 has a component flowing toward B of the solar cell module 13 and a component flowing toward $C_{fA}$ in A of the solar cell module 13 at the node PA. The series resistance component Rs increases by ΔR after B of the solar cell module 13 but the impedance of $C_{fA}$ does not increase, so that the increment $\Delta R_{frame}$ of the parasitic resistance component $R_{frame}$ is smaller than that in the case where the series resistance component $R_{sA}$ in A of the solar cell module 13 increases.

Similarly, in the case where the series resistance component $R_{sC}$ in C of the solar cell module 13 increases by ΔR, the increase amount $\Delta R_{frame}$ of the parasitic resistance component $R_{frame}$ is smaller than that in the case where the series resistance component RsB in B of the solar cell module 13 increases. This operation is repeated up to E of the solar cell module 13, and when $\Delta R_{frame}(N)$ is defined to be the increase amount $\Delta R_{frame}$ of the parasitic resistance component $R_{frame}$ in the case where the series resistance component $R_{sN}$ of a certain N-th solar cell module 13 increases by ΔR, a relationship $\Delta R_{frame}(A)>\Delta R_{frame}(B)>\Delta R_{frame}(C)>\Delta R_{frame}(D)>\Delta R_{frame}(E)>\Delta R_{frame}(F)$ is established, and as the position of the resistance increase approaches F, the parameter X approaches zero. Here, when the position of the resistance increase is at F, since it is assumed that the resistance increases for some reason between E of the solar cell module 13 and the output cable 12-2 shown in FIG. 1, and therefore, it does not affect the increase in the parasitic resistance component $R_{frame}$ between the first end of a plurality of the solar power generation units 13*a* connected in series and the frame 13*d* in the solar cell string 10, and thus $\Delta R_{frame}(F)$, the increase of the parasitic resistance component $R_{frame}$, is zero and the parameter X is zero. That is, the parameter X has a relationship in which it depends on the position of the solar cell module 13 as shown in FIG. 5.

FIG. 7 is a schematic diagram for describing the circuit diagram of FIG. 6 by a mathematical formula. Here, in each solar cell module 13, when defining the impedance between the positive side terminal box 13*b* and the negative side terminal box 13*c* in the solar cell modules 13 from A to E as $Z_N$, and the admittance due to the capacitance between the output terminal 11-1 in the solar cell modules 13 from A to E and the frame 13*d* as $Y_N$, and the angular frequency as ω, the impedance $Z_N$ and the admittance $Y_N$ are expressed as follows, and therefore, the circuit of FIG. 7 can be shown as a ladder circuit in which the impedance $Z_N$ and the admittance $Y_N$ are alternately connected in series and in parallel. Here, N indicates one of the solar cell modules 13 from A to E, and for example, in the case of the solar cell module 13 of A, the impedance is $Z_A$ and the admittance is $Y_A$.

$$Z_N = iL_S\omega + R_S + \frac{1}{i\omega C} \qquad \text{[Formula 1]}$$

$$Y_N = \frac{1}{\frac{1}{i\omega C_f}} = i\omega C_f \qquad \text{[Formula 2]}$$

When the impedance Z between the output terminal 11-1 for the solar cell modules 13 and the frame 13*d* is obtained on the basis of each of the impedances $Z_N$ and the admittances $Y_N$, the impedance Z can be expressed by the following formula.

[Formula 3]
$$Z = Z_A + \cfrac{1}{Y_A + \cfrac{1}{Z_B + \cfrac{1}{Y_B + \cfrac{1}{Z_C + \cfrac{1}{Y_C + \cfrac{1}{Z_D + \cfrac{1}{Y_D + \cfrac{1}{Z_E + \cfrac{1}{Y_E}}}}}}}}}$$

Using this formula, Z is calculated in each case in which the increase $\Delta R_s$ of the series resistance component obtained by the measurement between the output terminal 11-1 and the output terminal 11-2 in the solar cell modules 13 is added to one of $Z_A$ to $Z_E$. For example, when the series resistance component in C of the solar cell module 13 increases by $\Delta R_s$, since $\Delta R_s$ is a component that makes $Z_c$ increase serially, the impedance Z(C), which is the impedance Z between the output terminal 11-1 for the solar cell modules 13 and the frame 13d when the series resistance component in C of the solar cell module 13 increases by $\Delta R_s$, can be expressed by the following formula.

[Formula 4]
$$Z(C) = Z_A + \cfrac{1}{Y_A + \cfrac{1}{Z_B + \cfrac{1}{Y_B + \cfrac{1}{Z_C + \Delta R_s + \cfrac{1}{Y_C + \cfrac{1}{Z_D + \cfrac{1}{Y_D + \cfrac{1}{Z_E + \cfrac{1}{Y_E}}}}}}}}}$$

That is, since the real part of Z is equal to the parasitic resistance component $R_{frame}$, in cases where each of the series resistance components of A to E of the solar cell modules 13 increases by $\Delta R_s$, it can be seen that the second increment $\Delta R_{frame}$ in each case for the solar cell modules 13 has the relationship $\Delta R_{frame}(A) > \Delta R_{frame}(B) > \Delta R_{frame}(C) > \Delta R_{frame}(D) > \Delta R_{frame}(E) > \Delta R_{frame}(F)$ as in the above-described relationship. Therefore, the parameter X(A) to the parameter X(F) have the relationship as shown in FIG. 5, and thus the parameter X is a parameter depending on the position of the solar cell module with an increased resistance in the solar cell string 10.

With these reasons described above, the relationship between the parameter X of FIG. 5 and the position of the solar cell module 13 within the solar cell string 10 can be qualitatively explained.

In order to determine the position of the increased resistance of the solar cell module 13 in the solar cell string 10, for example, an equivalent circuit calculation is performed in advance to calculate the relationship between the parameter X and the position of the resistance increase of the solar cell module 13 in the solar cell string 10. Then, the parameter X obtained by measuring the frequency characteristics of the first and second impedances described above is compared with the calculated parameter X and the position of the solar cell module 13 can be determined by the calculated parameter X with the closest value.

Here, when the solar cell string 10 is composed of the solar cell modules 13 that have the same specifications and are connected serially, in the equivalent circuit calculation, the equivalent circuit and the circuit constants can be determined by measuring the frequency characteristics of the impedances of one solar cell module 13 beforehand on the basis of the equivalent circuit of the one solar cell module 13. Then, using the values, a circuit calculation in the case where the resistance value of the solar cell module 13 in the solar cell string 10 increases can be performed, and the relationship in FIG. 5 between the parameter X and the position of the solar cell module 13 can be determined. The circuit calculation in this case may be executed by a computer in the deterioration determining unit 36 or may be executed, for example, by an external computer and the result may be passed to the deterioration determining unit 36.

In the deterioration diagnosis device for the solar cell string and the photovoltaic power generation system equipped therewith, after the deterioration diagnosis device for the solar cell string and the photovoltaic power generation system equipped therewith as shown in FIG. 1 is installed, for example, during a time period of two hours after sunset or two hours before sunrise when the power generation amount is sufficiently low, the initial measurement of the first analysis process is performed to record the initial value $R_{s0}$ of the parasitic series resistance component Rs between the first end and the second end of a plurality of the solar power generation units 13a connected in series in the solar cell string 10. Similarly, the initial measurement of the second analysis process is performed to record the initial value $R_{frame0}$ of the parasitic resistance component $R_{frame}$ between the first end of a plurality of the solar power generation units 13a connected in series and the frame 13d in the solar cell string 10.

Thereafter, the first analysis process and the second analysis process are performed every day in the time period of two hours after sunset or two hours before sunrise in which the power generation amount is sufficiently low, and the analysis unit 34 calculates the first increment $\Delta R_s$ and the second increment $\Delta R_{frame}$. Then, the deterioration determining unit 36 calculates the parameter X on the basis of the first increment $\Delta R_s$ and the second increment $\Delta R_{frame}$ to monitor the parameter X every day.

For example, the threshold value of the first increment $\Delta R_s$ of the series resistance component increased due to deterioration of the power generation layer in the solar cell or corrosion of the electrode portion therein is set to 1Ω. For example, in the case where the first increment $\Delta R_s$ exceeds the threshold value 1Ω in the first analysis process performed by daily monitoring, the deterioration determining unit 36 performs the first deterioration determination process of determining, from the parameter X, the position of the solar cell module 13 whose resistance has increased. Then, the deterioration determining unit 36 can notify the user of the position of the solar cell module 13 in which the increase in the resistance value has occurred and which is determined on the basis of the parameter X.

As described above, the deterioration diagnosis device for the solar cell string and the photovoltaic power generation system equipped therewith according to the present embodiment can identify the position of the deteriorated solar cell module in the solar cell string.

Therefore, although, in the past, failure diagnosis was able to be performed only on a solar cell string basis, and a great deal of time and labor were required to identify the failed solar cell module in the solar cell string, the deterioration diagnosis device for the solar cell string and the photovoltaic power generation system equipped therewith according to the present embodiment can identify the position of the deteriorated solar cell module in the solar cell string, so that the time and labor required for the failure diagnosis of the solar cell modules in the solar cell string can be greatly reduced.

Further, in the deterioration diagnosis device for the solar cell string and the photovoltaic power generation system equipped therewith according to the present embodiment, since a high-frequency signal can be used in the measurement of the frequency characteristic of the impedance, the deterioration for many solar cell modules can be diagnosed. Further, since the deterioration diagnosis can be performed at night, which is a time period of two hours after sunset or two hours before sunrise in which the amount of generated power is sufficiently low, it is possible to prevent the total amount of generated power of the photovoltaic power generation system from being reduced due to the deterioration diagnosis.

Embodiment 2

In addition to the functions of the analysis unit 34 and the deterioration determining unit 36 of the deterioration diagnosis device 30 according to Embodiment 1, in a photovoltaic power generation system and a deterioration diagnosis device for a solar cell string according to the present embodiment, the analysis unit 34 calculates a third increment $\Delta R'_{frame}$ from the initial value of the resistance component between the second end of the negative electrode side of a plurality of the solar power generation units 13a connected in series and the frame 13d in the solar cell string 10, and the deterioration determining unit 36 calculates a parameter X' which depends on the position of the increased resistance in the solar cell string 10 as $X'=\Delta R'_{frame}/\Delta R_s$ and identifies the solar cell module 13 in which the resistance increase has occurred in the solar cell string 10 on the basis of the calculated parameter X and the parameter X'.

Figure 8:
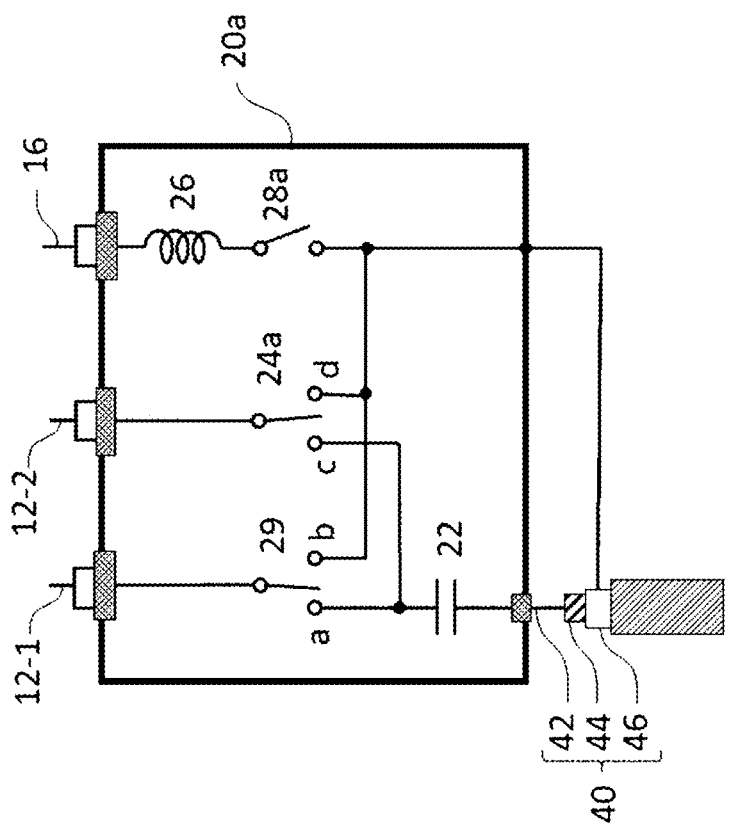
FIG. 8 is a diagram showing a schematic configuration of an inside of a connection box in a photovoltaic power generation system and a deterioration diagnosis device for a solar cell string according to Embodiment 2 of the present application.

The schematic configuration of the deterioration diagnosis device for the solar cell string and the photovoltaic power generation system according to the present embodiment is the same as that in FIG. 1 of Embodiment 1, and the description of the similar configuration except for the characteristic parts of the analysis unit 34 and the deterioration determining unit 36 of the present embodiment is omitted. FIG. 8 is a diagram showing a schematic configuration inside a connection box for the deterioration diagnosis device for the solar cell string and the photovoltaic power generation system according to the present embodiment. Parts denoted by the same reference numerals as in FIG. 2 are configured in the same manner as in the connection box 20 of Embodiment 1, and a detailed description thereof will be omitted.

As shown in FIG. 8, in addition to the configuration similar to the connection box 20 of Embodiment 1, the connection box 20a includes a switch 29 connected to the output cable 12-1, a switch 24a connected to the output cable 12-2, and a switch 28a connected between the other end of the inductor 26 connected to the grounding wire 16 and the outer conductor 46 of the coaxial cable 40.

The switch 29 can switch between a terminal a connected to the blocking capacitor 22 and a terminal b connected to the outer conductor 46 of the coaxial cable 40. The switch 24a can switch between a terminal c connected to the blocking capacitor 22 and a terminal d connected to the outer conductor 46 of the coaxial cable 40.

As will be described in detail later, by setting the switch 29 to the terminal a, the switch 24a to the terminal d, and the switch 28a to the off-state, the first end and the second end of a plurality of the solar power generation units 13a connected in series in the solar cell string 10 are electrically connected, and the frequency characteristic of the first impedance can be measured. Further, by setting the switch 29 to the terminal a, the switch 24a to the off-state, and the switch 28a to the on-state, the first end of the positive side of a plurality of the solar power generation units 13a connected in series in the solar cell string 10 is electrically connected to the frame 13d, and the frequency characteristic of the second impedance can be measured. Further, by turning off the switch 29, turning on the switch 24a at the terminal c, and turning on the switch 28a, the second end on the negative electrode side of the plurality of photovoltaic power generation units 13a connected in series in the solar cell string 10 is electrically connected to the frame 13d, and the frequency characteristic of the third impedance can be measured.

Figure 9:
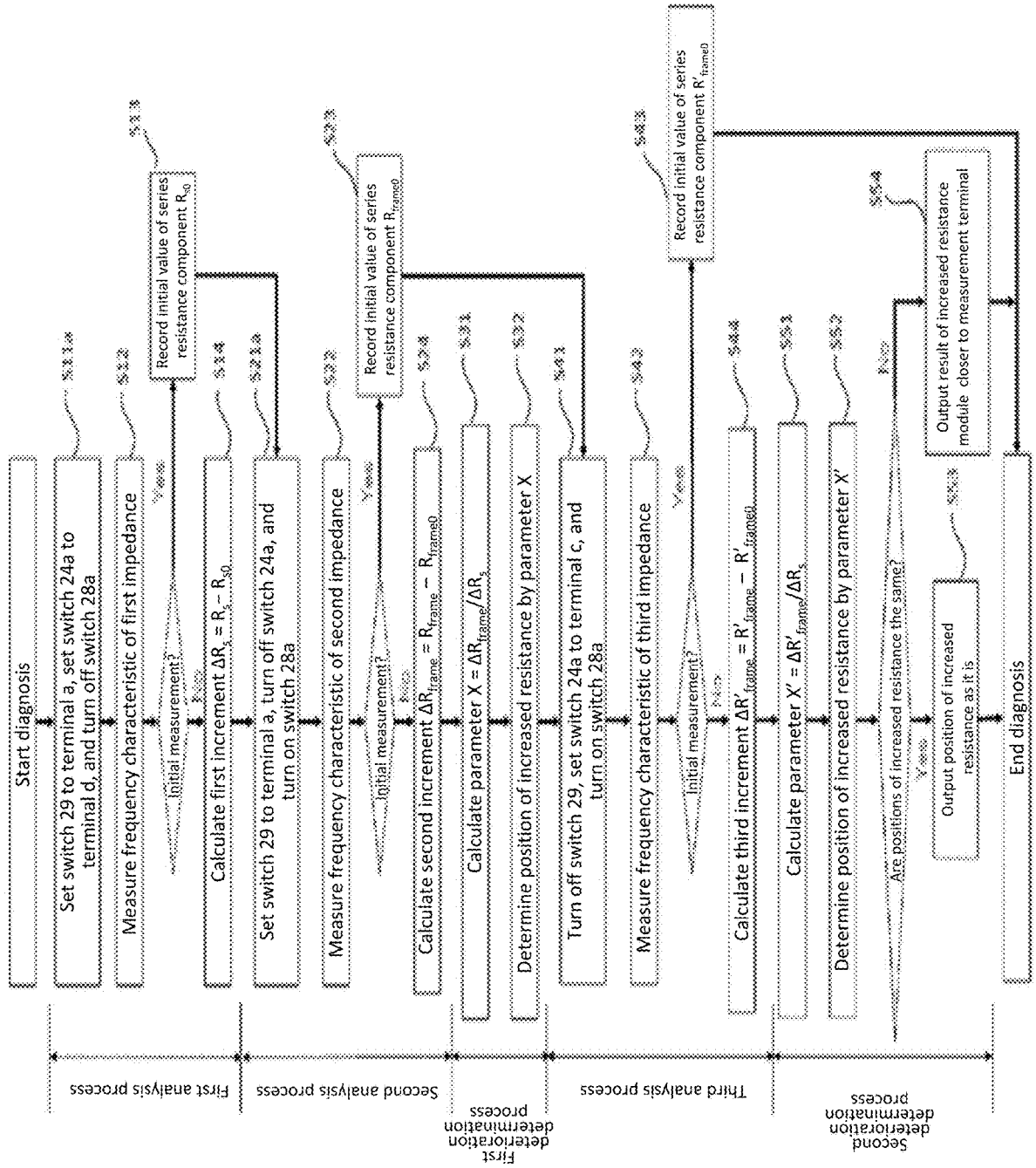
FIG. 9 is a flowchart showing operation of the deterioration diagnosis device according to Embodiment 2 of the present application.

Next, the operation of the deterioration diagnosis device 30 for the solar cell string 10 and the photovoltaic power generation system 100 according to the present embodiment will be described. FIG. 9 is a flowchart showing the operation of the deterioration diagnosis device 30 according to the present embodiment. Since parts denoted by the same reference numerals as those in FIG. 3 are the same as those in Embodiment 1, detailed description thereof will be omitted, and only differences from the Embodiment 1 will be described.

First, as in the Embodiment 1, when the deterioration diagnosis device 30 starts a diagnosis of the solar cell string 10, the solar cell string 10 is disconnected from the power transmission cables and the power conditioner (not shown) for the solar power generation by a switching means such as a switch (not shown) in the connection box 20, and is connected to the deterioration diagnosis device 30.

Then, as shown in FIG. 9, when the diagnosis of the solar cell string 10 is started, a first analysis process is performed.

First, as shown in FIG. 9, the switch 24a of the connection box 20a is set to the terminal d, and the switch 28a is set to the off-state. Thus, the output terminal 11-2 for the terminal box 13c on the negative electrode side of the solar cell string 10 is electrically connected to the outer conductor 46 of the coaxial cable 40 and the ground terminal of the impedance measuring instrument 32, and the frame 13d of the solar cell module 13 is electrically isolated from the ground terminal of the impedance measuring instrument 32. Next, the switch 29 of the connection box 20a is set to the terminal a, and the output terminal 11-1 for the terminal box 13b on the positive electrode side of the solar cell string 10 is electrically connected to the center conductor 42 of the coaxial cable 40 and the measurement terminal of the impedance measuring instrument 32 (S11a).

Thereafter, steps S12 to S14 of the first analysis process are performed, but the process is the same as that of Embodiment 1, a detailed description thereof will be omitted.

Next, when the first analysis process is completed, a second analysis process is performed.

First, as shown in FIG. 9, the switch 24a of the connection box 20a is turned off, and the switch 28a is turned on. Thus, the output terminal 11-2 for the terminal box 13c on the negative electrode side in the solar cell string 10 is electrically isolated from the ground terminal of the impedance measuring instrument 32, and the frame 13d of the solar cell module 13 is electrically connected to the outer conductor 46 of the coaxial cable 40 and the ground terminal of the impedance measuring instrument 32. The switch 29 of the connection box 20a is set to the terminal a, and the output terminal 11-1 for the terminal box 13b on the positive electrode side of the solar cell string 10 is electrically connected to the center conductor 42 of the coaxial cable 40 and the measurement terminal of the impedance measuring instrument 32 (S21a).

Thereafter, as shown in FIG. 9, steps S22 to S24 of the second analysis process are performed, but since the second analysis process is the same as the Embodiment 1, detailed description thereof will be omitted. In the case of the initial measurement, after step 23, the diagnosis is not ended, which is not as in Embodiment 1, and the process proceeds to a third analysis process described later.

Next, when the second analysis process is completed, a first deterioration determination process is performed. Since the first deterioration determination process is the same as that of Embodiment 1, detailed description thereof will be omitted. As shown in FIG. 9, a parameter $X=\Delta R'_{frame}/\Delta R_s$ is calculated on the basis of the first increment $\Delta R_s$ and the second increment $\Delta R_{frame}$ calculated in the first analysis process and the second analysis process (S31), and the first position of the solar cell module 13 in which the increase in the resistance value has occurred in the solar cell string 10 is identified on the basis of the parameter X (S32).

Next, when the first deterioration determination process is completed, the third analysis process is performed.

First, as shown in FIG. 9, the switch 24a of the connection box 20a is set to the terminal c, and the switch 28a is set to the on-state. Thus, the output terminal 11-2 for the terminal box 13c on the negative electrode side in the solar cell string 10 is electrically connected to the center conductor 42 of the coaxial cable 40 and the measurement terminal of the impedance measuring instrument 32, and the frame 13d of the solar cell module 13 is electrically connected to the outer conductor 46 of the coaxial cable 40 and the ground terminal of the impedance measuring instrument 32. Then, the switch 29 of the connection box 20a is turned off to electrically isolate the output terminal 11-1 for the terminal box 13b on the positive electrode side of the solar cell string 10 from the ground terminal of the impedance measuring instrument 32 (S41).

Next, with the switch 24a set to the terminal c, the switch 28a set to the on-state, and the switch 29 set to the off-state, the impedance measuring instrument 32 measures the frequency characteristic of the third impedance between the second end of the negative electrode side of a plurality of the solar power generation units 13a connected in series in the solar cell string 10 and the frame 13d of the solar cell module 13 (S42). Then, a resonance point of the third impedance is determined from the frequency characteristic of the measured third impedance, and a value of the third impedance at the resonance point is output to the analysis unit 34 in the subsequent stage.

Then, as shown in FIG. 9, the analysis unit 34 defines the value of the third impedance at the resonance point input from the impedance measuring unit 32 as the parasitic resistance component $R'_{frame}$ between the second end of the negative electrode side of a plurality of the solar power generation units 13a connected in series in the solar cell string 10 and the frame 13d, and when the impedance measurement process in step S42 is for an initial measurement after the deterioration diagnosis device 30 is installed, the analysis unit 34 records the value of the third impedance as the initial value $R'_{frame0}$ of the parasitic series resistance component in a storage device such as a semiconductor memory (S43), and the diagnosis of the initial measurement ends.

Here, for the parasitic resistance component $R'_{frame}$, the frequency characteristic of the third impedance between the second end on the negative electrode side of a plurality of the solar power generation units 13a connected in series and the frame 13d in the solar cell string 10 is measured, for example, in the range of 1 kHz to 1 MHz, and the impedance value which is the minimum value obtained at the resonance point is defined as the parasitic resistance component $R'_{frame}$ of the solar cell string 10.

After the initial measurement, as shown in FIG. 9, the analysis unit 34 defines the value of the third impedance at the resonance point input from the impedance measuring unit 32 as the parasitic resistance component $R'_{frame}$ between the second end of the negative electrode side of a plurality of the solar power generation units 13a connected in series and the frame 13d in the solar cell string 10, and calculates the third increment $\Delta R'_{frame}=R'_{frame}-R'_{frame0}$ from the initial value $R'_{frame0}$ of the parasitic resistance component $R'_{frame}$ between the second end of the negative electrode side of a plurality of the solar power generation units 13a connected in series in the solar cell string 10 (S44).

Then, the analysis unit 34 outputs the third increment $\Delta R'_{frame}$ calculated in the third analysis process to the deterioration determining unit 36.

Next, when the third analysis process is completed, a second deterioration determination process is performed.

First, as shown in FIG. 9, the deterioration determining unit 36 calculates a parameter $X'=\Delta R'_{frame}/\Delta R_s$ on the basis of the first increment $\Delta R_s$ and the third increment $\Delta R'_{frame}$ calculated in the first analysis process and the third analysis process (S51).

Since the parameter X' also depends on the position of the solar cell module 13 in the solar cell string 10 as in Embodiment 1, the deterioration determining unit 36 identifies a second position of the solar cell module 13 in which the increase in the resistance value has occurred in the solar cell string 10 on the basis of the parameter X' (S52).

Although the parameter X' is a parameter that depends on the position of the solar cell module 13 within the solar cell string 10, the relationship between the position of the solar cell module 13 and the value of the parameter X' is opposite to that of the parameter X in FIG. 5, and the parameter X' tends to increase from about 0 to 1 as the position of the solar cell module 13 moves from A to F. The inclination direction of the parameter X' is opposite to that of the parameter X, but since the principle is the same as that of Embodiment 1, the description thereof is omitted.

Next, a first position of the solar cell module 13 with an increased resistance determined by step S32 is compared with a second position of the solar cell module 13 with an increased resistance determined by step S52. At this time, if the first position and the second position in the solar cell modules 13 are the same, the determined position of the solar cell module 13 with an increased resistance as it is is output as a determination result (S53). On the other hand, when the first position and the second position in the solar cell modules 13 are different from each other, the determination result of the position of the solar cell module 13 measured at the output terminal which is closer to the module is output as a true determination result (S54) since the result measured at the closer terminal is more accurate, the output terminal being one of the output terminal 11-1 on the positive electrode side and the output terminal 11-2 on the negative electrode side in the solar cell string 10.

For example, it is assumed that in the first deterioration determination process, the deterioration determining unit 36 determines that the first position of the solar cell module 13 with an increased resistance is D, and in the second deterioration determination process, the deterioration determining unit 36 determines that the second position of the solar cell module 13 with an increased resistance is C. In this case, of the output terminal 11-1 on the positive electrode side and the output terminal 11-2 on the negative electrode side in the solar cell string 10, since the accuracy of the determination result measured at the closer output terminal 11-2 is higher, the deterioration determining unit 36 outputs the second position C of the solar cell module 13 determined in the second deterioration determining process as the true determination result.

As described above, in the deterioration diagnosis device in the solar cell string and the photovoltaic power generation system equipped therewith according to the present embodiment, the position of the deteriorated solar cell module in the solar cell string can be identified, and further, by using the measurement result at the output terminal on the side with high accuracy in the determination result, the position of the deteriorated solar cell module can be accurately determined even when the number of solar cell modules connected in series is large.

Further, since the deterioration diagnosis device for the solar cell string and the photovoltaic power generation system equipped therewith according to the present embodiment have the same configuration and operation principle as that of Embodiment 1, the deterioration diagnosis device for the solar cell string and the photovoltaic power generation system equipped therewith according to the present embodiment can identify the position of the deteriorated solar cell module in the solar cell string as in Embodiment 1, so that the time and labor required for the failure diagnosis of the solar cell module in the solar cell string can be greatly reduced. Further, in the deterioration diagnosis device for the solar cell string and the photovoltaic power generation system equipped therewith according to the present embodiment, since a high-frequency signal can be used in the measurement of the frequency characteristic of the impedance, the deterioration for many solar cell modules can be diagnosed. Further, since the deterioration diagnosis can be performed at night, which is a time period of two hours after sunset or two hours before sunrise in which the amount of generated power is sufficiently low, it is possible to prevent the total amount of generated power of the photovoltaic power generation system from being reduced due to the deterioration diagnosis.

In the present embodiment, the second analysis process is performed after the first analysis process, and the third analysis process is performed after the second analysis process, but the timing of performing each analysis process can be changed variously. Although the second deterioration determination process is performed after the first deterioration determination process in the present embodiment, the resistance increasing position may be determined by calculating the parameter X' beforehand, or the resistance increasing position may be determined by calculating the parameter X and the parameter X' simultaneously.

Embodiment 3

In the deterioration diagnosis device for the solar cell string and the photovoltaic power generation system according to the present embodiment, unlike Embodiment 2, the deterioration determining unit determines that the resistances of a plurality of the solar cell modules in the solar cell string have increased on the basis of the calculated parameters X and X'.

The schematic configuration of the deterioration diagnosis device for the photovoltaic power generation system and the solar cell string according to the present embodiment is the same as that of FIG. 1 of Embodiment 1 and FIG. 8 of Embodiment 2, and the description of the similar configuration except for the characteristic part of the deterioration determining unit 36 of the present embodiment is omitted.

Figure 10:
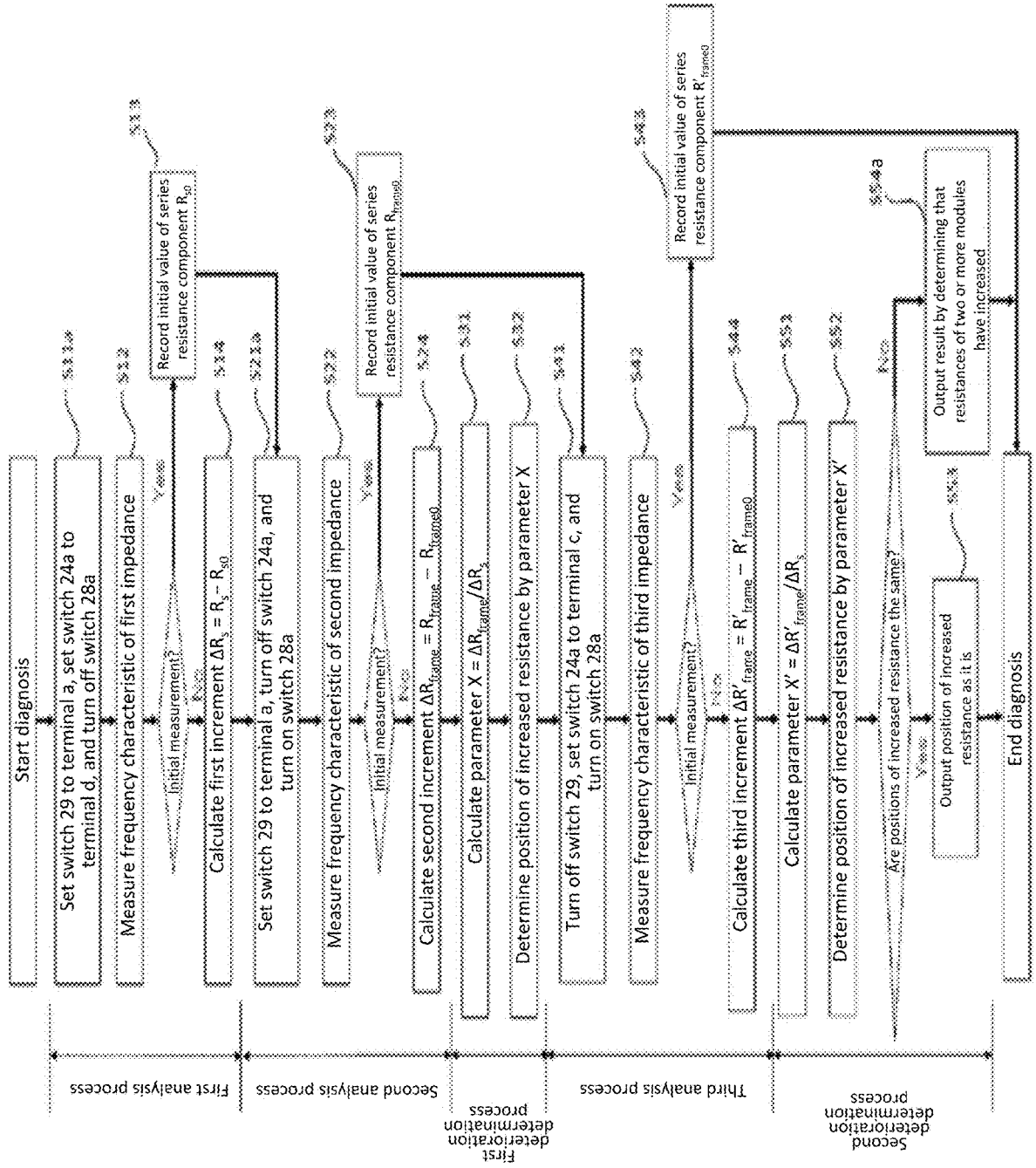
FIG. 10 is a flowchart showing operation of a deterioration diagnosis device according to Embodiment 3 of the present application.

Next, the operation of the deterioration diagnosis device 30 for the solar cell string 10 and the photovoltaic power generation system 100 according to the present embodiment will be described. FIG. 10 is a flowchart showing the operation of the deterioration diagnosis device 30 according to the present embodiment. Since parts denoted by the same reference numerals as those in FIG. 9 of Embodiment 2 are the same as those in Embodiment 2, detailed description thereof will be omitted, and only differences from Embodiment 2 will be described.

The operation of the deterioration diagnosis device 30 for the solar cell string 10 and the photovoltaic power generation system 100 according to the present embodiment is the same as that of Embodiment 2 in the first analysis process, the second analysis process, the first deterioration determination process, the third analysis process, and the second deterioration determination process up to step S52.

The position of the solar cell module 13 with an increased resistance determined in step S32 is then compared to the position of the solar cell module 13 with an increased resistance determined in step S52. At this time, if the positions of the solar cell module 13 are the same, the determined position of the solar cell module 13 with an increased resistance is output as a determination result (S53) as it is. In contrast, when the positions of the solar cell modules 13 are different from each other, it is considered that the solar cell module 13 in which the resistance has increased in the solar cell string 10 is not only one, and therefore, the deterioration determining unit 36 determines that the resistances of a plurality of the solar cell modules 13 in the solar cell string 10 have increased, and outputs the result (S54a).

For example, it is assumed that in the first deterioration determination process, the deterioration determining unit 36 determines that the position of the solar cell module 13 with an increased resistance is D, and in the second deterioration determination process, the deterioration determining unit 36 determines that the position of the solar cell module 13 with an increased resistance is A. In this case, since it is considered that the solar cell module 13 in the solar cell string 10 in which the resistance has increased is not only one, the deterioration determining unit 36 determines that the resistances of a plurality of the solar cell modules 13 in the solar cell string 10 have increased, and outputs the result.

As described above, in the deterioration diagnosis device for the solar cell string and the photovoltaic power generation system equipped therewith according to the present embodiment, it is possible to determine that the resistances of two or more of the solar cell modules 13 in the solar cell string 10 have increased and to output the result, so that it is possible to inform the user of the progress in the deterioration in two or more of the solar cell modules. Further, the user can understand the status of the deterioration in detail including the status in which two or more solar cell modules are deteriorated.

Further, since the deterioration diagnosis device for the solar cell string and the photovoltaic power generation system equipped therewith according to the present embodiment have the same configuration and operation principle as that of Embodiment 1, the deterioration diagnosis device for the solar cell string and the photovoltaic power generation system equipped therewith according to the present embodiment can identify the position of the deteriorated solar cell module in the solar cell string as in Embodiment 1, so that the time and labor required for the failure diagnosis of the solar cell module in the solar cell string can be greatly reduced. Further, in the deterioration diagnosis device for the solar cell string and the photovoltaic power generation system equipped therewith according to the present embodiment, since a high-frequency signal can be used in the measurement of the frequency characteristic of the impedance, the deterioration for many solar cell modules can be diagnosed. Further, since the deterioration diagnosis can be performed at night, which is a time period of two hours after sunset or two hours before sunrise in which the amount of generated power is sufficiently low, it is possible to prevent the total amount of generated power of the photovoltaic power generation system from being reduced due to the deterioration diagnosis.

Embodiment 4

In the deterioration diagnosis device for the solar cell string and the photovoltaic power generation system according to the present embodiment, unlike Embodiment 1, the resistance increase of each solar cell module that changes over time is recorded, and a deteriorated solar cell module is identified on the basis of integrated resistance increases of the solar cell modules.

The schematic configuration of the deterioration diagnosis device for the solar cell string and the photovoltaic power generation system according to the present embodiment is the same as that in FIG. 1 of Embodiment 1, and the description of the similar configuration except for the characteristic parts of the analysis unit 34 and the deterioration determining unit 36 of the present embodiment is omitted.

Further, since the schematic configuration inside the connection box of the deterioration diagnosis device for the solar cell string and the photovoltaic power generation system according to the present embodiment is also the same as that of Embodiment 1, detailed description thereof will be omitted.

In the photovoltaic power generation system and the deterioration diagnosis device for the solar cell string according to the present embodiment, the resistance increase of each solar cell module that changes over time is recorded, and the deteriorated solar cell module is identified on the basis of an integrated resistance increase value of each solar cell module.

Although the details will be described later, the analysis unit 34 records the value of the first impedance at the resonance point input from the impedance measuring unit 32 in a storage device such as a semiconductor memory as the parasitic series resistance component $Rs(k)$ between the first end and the second end of the plurality of photovoltaic power generating units 13a connected in series of the solar cell string 10. Then, a fourth increment $\Delta Rs(k)=Rs(k)-Rs(k-1)$ from the previous measurement value $Rs(k-1)$ of the series resistance component between the first end and the second end of the plurality of photovoltaic power generation units 13a connected in series of the solar cell string 10 is calculated.

The analysis unit 34 records the value of the second impedance at the resonance point input from the impedance measuring unit 32 in a storage device such as a semiconductor memory as a parasitic resistance component $R_{frame}(k)$ between the first end of a plurality of the solar power generation units 13a connected in series and the frame 13d in the solar cell string 10. Then, a fifth increment $\Delta R_{frame}(k)=R_{frame}(k)-R_{frame}(k-1)$ from the previous measurement value $R_{frame}(k-1)$ of the parasitic resistance component between the first end of a plurality of the solar power generation units 13a connected in series and the frame 13d in the solar cell string 10 is calculated.

Then, the analysis unit 34 outputs the fourth increment $\Delta R_s(k)$ and the fifth increment $\Delta R_{frame}(k)$ to the deterioration determining unit 36.

On the basis of the fourth increment $\Delta R_s(k)$ and the fifth increment $\Delta R_{frame}(k)$ calculated by the analysis unit 34, the deterioration determining unit 36 determines the position of the solar cell module 13 in which the resistance has increased within the solar cell string 10.

Although the details will be described later, the deterioration determining unit 36 calculates a parameter $X(k)$ depending on the position of the increased resistance in the solar cell string 10 by using the fourth increment $\Delta R_s(k)$ and the fifth increment $\Delta R_{frame}(k)$ calculated by the analysis unit 34 as $X(k)=\Delta R_{frame}(k)/\Delta R_s(k)$. Then, on the basis of the calculated parameter $X(k)$, the deterioration determining unit 36 identifies the position of the solar cell module 13 in which the resistance value has increased in the solar cell string 10.

Then, the deterioration determining unit 36 adds the fourth increment $\Delta R_s(k)$ to the series resistance value $R_{sy}$ of the solar cell module 13 at the position where the resistance increase has occurred and records the result in a storage device such as a semiconductor memory.

Figure 11:
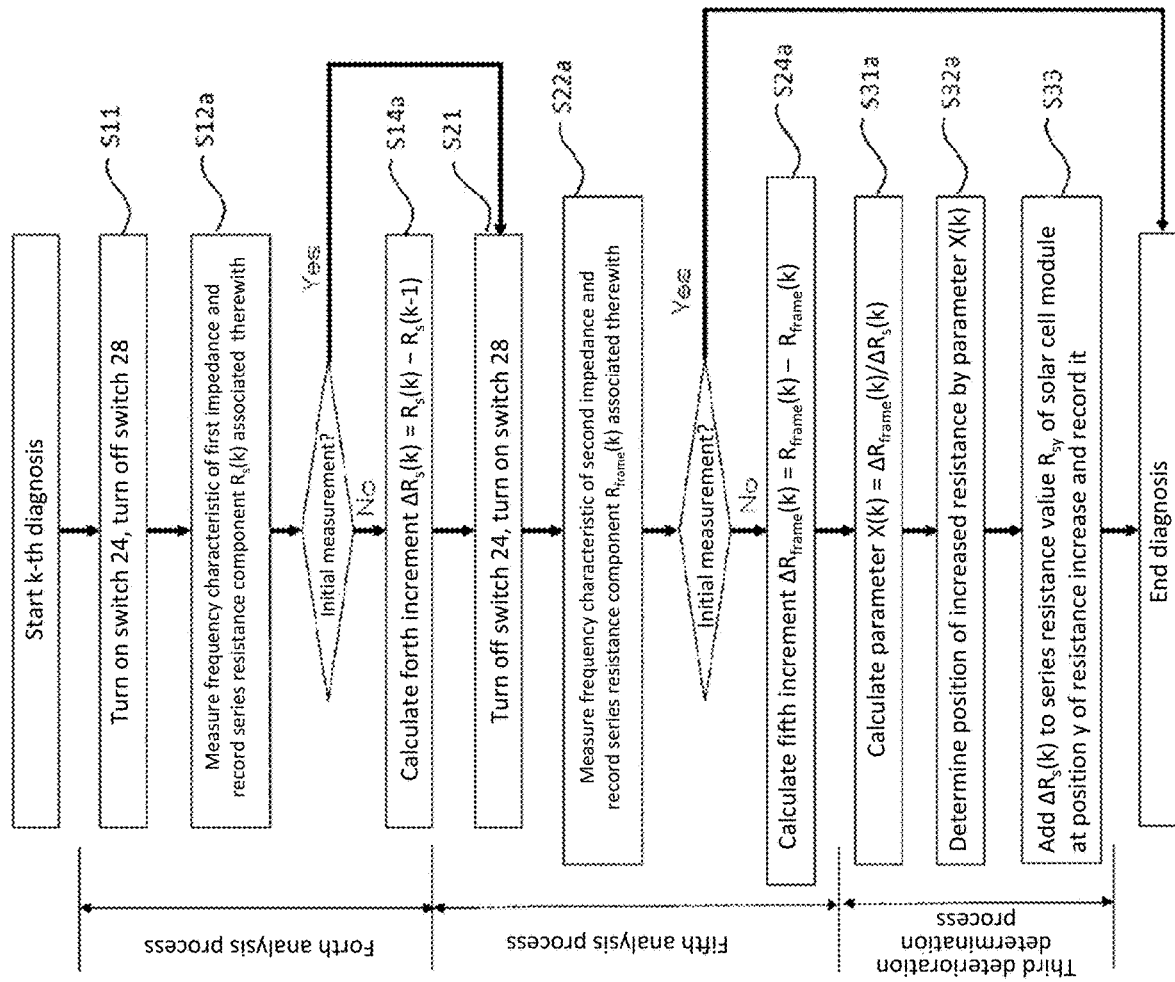
FIG. 11 is a flowchart showing operation of a deterioration diagnosis device according to Embodiment 4 of the present application.

Next, the operation of the deterioration diagnosis device 30 for the solar cell string 10 and the photovoltaic power generation system 100 according to the present embodiment will be described. FIG. 11 is a flowchart showing the operation of the deterioration diagnosis device 30 according to the present embodiment. Since parts denoted by the same reference numerals as those in FIG. 3 are the same as those in Embodiment 1, detailed description thereof will be omitted, and only differences from Embodiment 1 will be described.

First, when the deterioration diagnosis device 30 starts the k-th diagnosis of the solar cell string 10, the solar cell string 10 is disconnected from the power transmission cable and the power conditioner (not shown) for the solar power generation by a switching means such as a switch (not shown) in the connection box 20, and is connected to the deterioration diagnosis device 30.

Then, as shown in FIG. 11, when the k-th diagnosis of the solar cell string 10 is started, a fourth analysis process is performed.

First, as shown in FIG. 11, the switch 24 of the connection box 20 is turned on, and the output terminal of the terminal box 13c on the negative side of the solar cell string 10 is electrically connected to the outer conductor 46 of the coaxial cable 40 and the ground terminal of the impedance measuring instrument 32. Then, the switch 28 of the connection box 20 is turned off to electrically isolate the frame 13d of the solar cell module 13 from the ground terminal of the impedance measuring instrument 32 (S11).

Next, as shown in FIG. 11, with the switch 24 turned on and the switch 28 turned off, the impedance measuring instrument 32 measures the frequency characteristic of the first impedance between first end and the second end of a plurality of the solar power generation units 13a connected in series in the solar cell string 10. Then, the resonance point of the first impedance is determined from the frequency characteristic of the measured first impedance, and the value of the first impedance at the resonance point is output to the analysis unit 34 in the subsequent stage.

Then, as shown in FIG. 11, the analysis unit 34 defines the value of the first impedance at the resonance point input from the impedance measuring instrument 32 in the k-th diagnosis as the parasitic series resistance component Rs(k) between the first end and the second end of a plurality of the solar power generation units 13a connected in series in the solar cell string 10, and records it in a storage device such as a semiconductor memory (S12a). In the case where the impedance measurement process of step S12a is the initial measurement which is the first measurement after the deterioration diagnosis device 30 is installed, as shown in FIG. 11, the analysis unit 34 records the initial value Rs(1) of the parasitic series resistance component in a storage device such as a semiconductor memory, and then the process proceeds to the step S21.

After the initial measurement, as shown in FIG. 11, the analysis unit 34 calculates a fourth increment $\Delta R_s(k)=Rs(k)-Rs(k-1)$, which is an increment from the previous measurement value Rs(k-1), by using the previous measurement value Rs(k-1) of the parasitic series resistance component between the first end and the second end of a plurality of the solar power generation units 13a connected in series in the solar cell string 10 as the initial value, and outputs the calculated fourth increment $\Delta R_s(k)$ to the deterioration determining unit 36 (S14a).

Next, when the fourth analysis process is completed, a fifth analysis process is performed.

First, as shown in FIG. 11, the switch 24 of the connection box 20 is turned off to electrically isolate the output terminal of the terminal box 13c on the negative side of the solar cell string 10 from the outer conductor 46 of the coaxial cable 40 and the ground terminal of the impedance measuring instrument 32. Then, the switch 28 of the connection box 20 is turned on to electrically connect the frame 13d of the solar cell module 13 and the ground terminal of the impedance measuring instrument 32 (S21).

Next, as shown in FIG. 11, with the switch 24 turned off and the switch 28 turned on, the impedance measuring instrument 32 measures the frequency characteristic of the second impedance between the first end of the positive electrode side of a plurality of the solar power generation units 13a connected in series in the solar cell string 10 and the frame 13d of the solar cell module 13. Then, the resonance point of the second impedance is determined from the frequency characteristic of the measured second impedance, and the value of the second impedance at the resonance point is output to the analysis unit 34 in the subsequent stage.

Then, as shown in FIG. 11, the analysis unit 34 defines the value of the second impedance at the resonance point input from the impedance measuring instrument 32 in the k-th diagnosis as the parasitic resistance component $R_{frame}(k)$ between the first end of a plurality of the solar power generating units 13a connected in series and the frame 13d in the solar cell string 10, and records the value in a storage device such as a semiconductor memory (S22a). In the case where the impedance measurement process of step S22a is the initial measurement, which is the first measurement after the deterioration diagnosis device 30 is installed, the initial value $R_{frame}(1)$ of the parasitic series resistance component is recorded in a storage device such as a semiconductor memory, and the diagnosis of the initial measurement is ended.

After the initial measurement, as shown in FIG. 11, the analysis unit 34 calculates a fifth increment $\Delta R_{frame}(k)=R_{frame}(k)-R_{frame}(k-1)$, which is an increment from the previous measurement value $R_{frame}(k-1)$, by using the previous measurement value $R_{frame}(k-1)$ of the parasitic resistance component between the first end of a plurality of the solar power generating units 13a connected in series and the frame 13d in the solar cell string 10 as the initial value, and outputs the calculated fifth increment $\Delta R_{frame}(k)$ to the deterioration determining unit 36 (S24a).

Next, when the fifth analysis process is completed, a third deterioration determination process is performed.

First, as shown in FIG. 11, the deterioration determining unit 36 calculates a parameter $X(k)=\Delta R_{frame}(k)/\Delta R_s(k)$ on the basis of the fourth increment $\Delta R_s(k)$ and the fifth increment $\Delta R_{frame}(k)$ calculated in the fourth analysis process and the fifth analysis process (S31a).

Since the parameter X(k) is dependent on the position of the solar cell module 13 in the solar cell string 10, the deterioration determining unit 36 identifies the solar cell module 13 in which the increase in the resistance value has occurred in the solar cell string 10 on the basis of the parameter X(k) (S32a).

Next, as shown in FIG. 11, $\Delta R_s(k)$ is added to the series resistance value $R_{sy}$ of the solar cell module 13 at the position y of the increased resistance, which is determined on the basis of the parameter X(k) that the resistance value has increased, and the result is recorded in a storage device such as a semiconductor memory as the series resistance value $R_{sy}$ of the solar cell module 13 at the position y of the increased resistance (S33). The series resistance value $R_{sy}$ of the solar cell module 13 at the position y of the increased resistance is used for the subsequent diagnosis, and after the initial measurement, the fourth increment $\Delta R_s(k)$ is added to the recorded series resistance value $R_{sy}$ of each solar cell module 13 every time the diagnosis is performed.

Here, the initial series resistance value $R_{sy}$ of each solar cell module 13 may be obtained before the initial measurement and recorded in a storage device such as a semiconductor memory, or assuming that the initial resistance values of all solar cell modules 13 in the solar cell string 10 are the same, a value obtained by dividing the series resistance value Rs(1) obtained by the initial measurement by the number of solar cell modules 13 may be used as the initial series resistance value $R_{sy}$.

Here, the parameter X(k) is calculated not by the initial values measured in the initial measurement but by the fourth increment $\Delta R_s(k)$ and the fifth increment $\Delta R_{frame}(k)$ obtained on the basis of the previous measurement value. Therefore, the parameter X(k) is affected by the changes of the resistance values of solar cell modules 13 whose resistances have increased with the passage of time, and the inclination, etc. of the parameter X(k) is likely to change over time, compared with that of the parameter X obtained from the initial values in Embodiment 1, so that the position of the solar cell module 13 whose resistance has increased may not be accurately determined. In the present embodiment, in order to cope with the change of the parameter X(k) with the passage of time, in the step S32a of determining the position of the solar cell module 13 with an increased resistance, the relationship between the parameter X(k) and the position of the solar cell module 13 with an increased resistance in the k-th diagnosis is corrected in advance on the basis of the series resistance value of each solar cell module 13 which has added and has been recorded so far, so that the solar cell module 13 with an increased resistance can be identified on the basis of the corrected relationship between the parameter X(k) and the position of the solar cell module 13 in which the increase in the resistance value has occurred.

Here, the correction of the relationship between the parameter X(k) and the position of the solar cell module 13 with an increased resistance does not need to be performed every time the diagnosis is performed, and the correction of the relationship between the parameter X(k) and the position of the solar cell module 13 with an increased resistance may be performed on the basis of the increases in the accumulated resistances of the solar cell modules 13, or the correction of the relationship between the parameter X(k) and the position of the solar cell module 13 with an increased resistance may be performed every predetermined number of times the diagnosis is performed.

In the deterioration diagnosis device 30 for the solar cell string and the photovoltaic power generation system 100 equipped therewith as described above, when the accumulated series resistance value $R_{sy}$ of one solar cell module 13 in the solar cell string 10 exceeds a predetermined threshold, the degradation determining unit 36 can determine that the resistance has increased, for example, due to the deterioration of the power generation layer in a solar cell in the one solar cell module 13 or corrosion of the electrode portion therein and inform the user of the position of the solar cell module 13 in which the increase in the resistance value has occurred.

Here, in the present embodiment, the fifth analysis process is performed after the fourth analysis process, but the fourth analysis process may be performed after the fifth analysis process.

Further, in the present embodiment, the solar cell module 13 in which the increase in the resistance value has occurred is identified on the basis of the integrated series resistance value $R_{sy}$ obtained by adding $\Delta R_s(k)$ to the series resistance value $R_{sy}$ of the solar cell module 13. Or, it is also possible that the integrated value by $\Delta R_s(k)$ for each solar cell module 13 is recorded and the integrated value and a threshold value are compared, so that the solar cell module 13 in which the increase in the resistance value has occurred is identified and the user is informed of the result.

As described above, in the deterioration diagnosis device for the solar cell string and the photovoltaic power generation system equipped therewith, it is possible to identify the position of the deteriorated solar cell module in the solar cell string, and further, it is possible to record the resistance increase of each solar cell module that changes over time and estimate the integrated resistance increase of each solar cell module.

Therefore, as compared with Embodiment 1, it is possible to accurately identify the position of the deteriorated solar cell module in the solar cell string, so that it is possible to further reduce the time and labor required for failure diagnosis of the solar cell module in the solar cell string.

Further, in addition to the present embodiment, since the deterioration diagnosis device for the solar cell string and the photovoltaic power generation system equipped therewith according to the present embodiment have the same configuration and operation principle as those of Embodiment 1, the deterioration diagnosis device for the solar cell string and the photovoltaic power generation system equipped therewith according to the present embodiment can identify the position of the deteriorated solar cell module in the solar cell string as in Embodiment 1, so that the time and labor required for the failure diagnosis of the solar cell module in the solar cell string can be greatly reduced. Further, in the deterioration diagnosis device for the solar cell string and the photovoltaic power generation system equipped therewith according to the present embodiment, since a high-frequency signal can be used in the measurement of the frequency characteristic of the impedance, the deterioration for many solar cell modules can be diagnosed. Further, since the deterioration diagnosis can be performed at night, which is a time period of two hours after sunset or two hours before sunrise in which the amount of generated power is sufficiently low, it is possible to prevent the total amount of generated power of the photovoltaic power generation system from being reduced due to the deterioration diagnosis.

The present embodiment can also be applied to Embodiment 2 and Embodiment 3. That is, as in the present embodiment, the k-th increment of Rs and $R_{frame}$ may be calculated on the basis of the previous measurement value by using the resistance component between the frame 13d and the second end of the negative electrode side of a plurality of the solar power generation units 13a connected in series in the solar cell string 10, and the parameter X'(k) may be calculated. In this case, on the basis of the calculated parameter X(k) and the parameter X'(k), the position of the solar cell module 13 in which the increase in the resistance value has occurred in the solar cell string 10 can be more accurately identified, so that the time and labor required for failure diagnosis of the solar cell module in the solar cell string are further reduced.

In the present disclosure, it is possible to freely combine embodiments, and the embodiments can be appropriately modified or omitted within the scope of the present disclosure. Further, the present disclosure is not limited to the above-described embodiments and can be variously modified in the implementation stage without departing from the gist thereof. Further, the above-described embodiments include inventions at various stages, and various inventions can be extracted by an appropriate combination of the disclosed constituent requirements.

DESCRIPTION OF REFERENCE NUMERALS AND SIGNS 10 solar cell string, 13 solar cell module, 20, 20a connection box, 30 deterioration diagnosis device, 32 impedance measuring instrument, 34 analysis unit, 36 deterioration determining unit, 100 photovoltaic power generation system

The invention claimed is:

1. A deterioration diagnosis device for a solar cell string including a plurality of solar cell modules each of which has a solar power generation unit and a conductive frame, the solar power generation units of the plurality of solar cell modules being electrically connected in series, the frames of the plurality of solar cell modules being electrically connected in common, the deterioration diagnosis device comprising:
an impedance measuring circuit to measure a frequency characteristic of a first impedance between a first end and a second end of the plurality of solar power generation units connected in series in the solar cell string and to measure a frequency characteristic of a second impedance between the first end of the plurality of solar power generation units connected in series and the frames in the solar cell string;
a processing circuit configured as an analysis unit to calculate a first increment from an initial value of a series resistance component between the first end and the second end of the plurality of solar power generation units connected in series in the solar cell string based on the frequency characteristic of the first impedance, and to calculate a second increment from an initial value of a resistance component between the first end of the plurality of solar power generation units connected in series and the frames in the solar cell string based on the frequency characteristic of the second impedance, the initial value of the series resistance component between the first end and the second end of the plurality of solar generation units being a minimum impedance value obtained at a resonance point determined according to the frequency characteristic of the first impedance, and the initial value of the series resistance component between the first end of the plurality of solar power generation units and the frames in the solar cell string being a minimum impedance value obtained at a resonance point determined according to the frequency characteristics of the second impedance; and
the processing circuit further configured as a deterioration determining unit to determine a position of a solar cell module having an increased resistance in the solar cell string based on the first increment and the second increment calculated by the analysis unit.

2. The deterioration diagnosis device for the solar cell string according to claim 1, wherein the initial value of the series resistance component and the initial value of the resistance component are values at the time of initial measurement of the solar cell string.

3. The deterioration diagnosis device for the solar cell string according to claim 1, wherein, when the first increment is $\Delta R_s$ and the second increment is $\Delta R_{frame}$, the analysis unit calculates a value of $\Delta R_{frame}/\Delta R_s$, and the deterioration determining unit determines a position of the solar cell module having an increased resistance in the solar cell string based on the value of $\Delta R_{frame}/\Delta R_s$.

4. The deterioration diagnosis device for the solar cell string according to claim 3, wherein the impedance measuring circuit measures a frequency characteristic of a third impedance between the second end of the plurality of solar power generation units connected in series and the frames in the solar cell string;
the analysis unit calculates a third increment from an initial value of a resistance component between the second end of the plurality of solar power generation units connected in series and the frames in the solar cell string based on the frequency characteristic of the third impedance; and
the deterioration determining unit determines a position of the solar cell module having an increased resistance in the solar cell string based on the first increment, the second increment and the third increment calculated by the analysis unit.

5. The deterioration diagnosis device for the solar cell string according to claim 4, wherein, when $\Delta R'_{frame}$ is defined as the third increment, the analysis unit calculates a value of $\Delta R'_{frame}/\Delta R_s$, and the deterioration determining unit determines a position of the solar cell module having an increased resistance in the solar cell string based on the value of $\Delta R_{frame}/\Delta R_s$ and the value of $\Delta R'_{frame}/\Delta R_s$.

6. The deterioration diagnosis device for the solar cell string according to claim 5, wherein the deterioration determining unit determines a first position of the solar cell module having an increased resistance in the solar cell string based on the value of $\Delta R_{frame}/\Delta R_s$, determines a second position of the solar cell module having an increased resistance in the solar cell string based on the value of $\Delta R'_{frame}/\Delta R_s$, and determines that the solar cell module closer to the output terminal used for measurement is the solar cell module having an increased resistance when the first position and the second position are different from each other.

7. The deterioration diagnosis device for the solar cell string according to claim 5, wherein the deterioration determining unit determines a first position of the solar cell module having an increased resistance in the solar cell string based on the value of $\Delta R_{frame}/\Delta R_s$, determines a second position of the solar cell module having an increased resistance in the solar cell string based on the value of $\Delta R'_{frame}/\Delta R_s$, and determines that resistances of the plurality of solar cell modules in the solar cell string have increased when the first position and the second position are different from each other.

8. The deterioration diagnosis device for the solar cell string according to claim 1, wherein
the initial value of the series resistance component is the series resistance component of the solar cell string measured last time and the initial value of the resistance component is the resistance component of the solar cell string measured last time;
the analysis unit calculates the first increment and the second increment based on the series resistance component and the resistance component of the solar cell string measured last time; and
the deterioration determining unit adds the first increment to the series resistance value measured last time of the solar cell module at a position determined based on the first increment and the second increment to record the sum.

9. A photovoltaic power generation system comprising:
a solar cell string provided with a plurality of solar cell modules each of which has a solar power generation unit and a conductive frame, the solar power generation units of the plurality of solar cell modules being electrically connected in series, the frames of the plurality of solar cell modules being electrically connected in common; and the deterioration diagnosis device for the solar cell string according to claim 1.

10. A deterioration diagnosis method using a deterioration diagnosis device for a solar cell string including a plurality of solar cell modules each of which has a solar power generation unit and a conductive frame, the solar power generation units of the plurality of solar cell modules being electrically connected in series, the frames of the plurality of solar cell modules being electrically connected in common, the deterioration diagnosis method comprising:

measuring a frequency characteristic of a first impedance between a first end and a second end of the plurality of solar power generation units connected in series in the solar cell string and measuring a frequency characteristic of a second impedance between the first end of the plurality of solar power generation units connected in series and the frames in the solar cell string by using the deterioration diagnosis device;

calculating a first increment from an initial value of a series resistance component between the first end and the second end of the plurality of solar power generation units connected in series in the solar cell string based on the frequency characteristic of the first impedance, and calculating a second increment from an initial value of a resistance component between the first end of the plurality of solar power generation units connected in series and the frames in the solar cell string based on the frequency characteristic of the second impedance by using the deterioration diagnosis device, the initial value of the series resistance component between the first end and the second end of the plurality of solar generation units being a minimum impedance value obtained at a resonance point determined according to the frequency characteristic of the first impedance, and the initial value of the series resistance component between the first end of the plurality of solar power generation units and the frame in the solar cell string being a minimum impedance value obtained at a resonance point determined according to the frequency characteristics of the second impedance; and determining a position of a solar cell module having an increased resistance in the solar cell string based on the calculated first increment and the calculated second increment by using the deterioration diagnosis device.

11. A deterioration diagnosis device for a battery string including a plurality of battery modules each of which has a plurality of battery cells and a conductive frame, the plurality of battery modules being electrically connected in series, the frames of the plurality of battery modules being electrically connected in common, the deterioration diagnosis device comprising:

an impedance measuring circuit to measure a frequency characteristic of a first impedance between a first end and a second end of the plurality of battery modules connected in series in the battery string and to measure a frequency characteristic of a second impedance between the first end of the plurality of battery modules connected in series and the frames in the battery string;

a processing circuit configured as an analysis unit to calculate a first increment from an initial value of a series resistance component between the first end and the second end of the plurality of battery modules connected in series in the battery string based on the frequency characteristic of the first impedance, and to calculate a second increment from an initial value of a resistance component between the first end of the plurality of battery modules connected in series and the frames in the battery string based on the frequency characteristic of the second impedance, the initial value of the series resistance component between the first end and the second end of the plurality of solar generation units being a minimum impedance value obtained at a resonance point determined according to the frequency characteristic of the first impedance, and the initial value of the series resistance component between the first end of the plurality of solar power generation units and the frames in the solar cell string being a minimum impedance value obtained at a resonance point determined according to the frequency characteristics of the second impedance; and the processing circuit further configured as a deterioration determining unit to determine a position of a battery module having an increased resistance in the battery string based on the first increment and the second increment calculated by the analysis unit.

* * * * *